(12) United States Patent
Ota et al.

(10) Patent No.: US 12,033,718 B2
(45) Date of Patent: Jul. 9, 2024

(54) SEMICONDUCTOR DEVICE

(71) Applicant: Kioxia Corporation, Tokyo (JP)

(72) Inventors: Kensuke Ota, Yokohama Kanagawa (JP); Marina Yamaguchi, Shibetsu Hokkaido (JP); Masatoshi Yoshikawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 106 days.

(21) Appl. No.: 17/944,725

(22) Filed: Sep. 14, 2022

(65) Prior Publication Data

US 2023/0298643 A1 Sep. 21, 2023

(30) Foreign Application Priority Data

Mar. 16, 2022 (JP) .................... 2022-041171

(51) Int. Cl.
*G11C 7/10* (2006.01)
*G06N 20/00* (2019.01)
*G11C 7/14* (2006.01)

(52) U.S. Cl.
CPC .......... *G11C 7/1096* (2013.01); *G06N 20/00* (2019.01); *G11C 7/1066* (2013.01); *G11C 7/109* (2013.01); *G11C 7/14* (2013.01)

(58) Field of Classification Search
CPC ..... G11C 7/1096; G11C 7/1066; G11C 7/109; G11C 7/14; G11C 2013/0092; G11C 2213/77; G11C 11/54; G11C 13/003; G11C 13/004; G11C 13/0069; G06N 20/00; G06N 3/065; G06N 3/09; G06N 3/044

(Continued)

(56) References Cited

U.S. PATENT DOCUMENTS 10,153,806 B1 12/2018 Petre et al.
10,162,378 B1 12/2018 Rao et al.
(Continued)

FOREIGN PATENT DOCUMENTS

CN 106603079 A * 4/2017
JP 2008-306011 A 12/2008
(Continued)

OTHER PUBLICATIONS

Berdan, R., et al., "Low-power linear computation using nonlinear ferroelectric tunnel junction memristors," Nature Electronics, 3:259-266 (2020) (8 pages).

(Continued)

*Primary Examiner* — Michael T Tran
(74) *Attorney, Agent, or Firm* — Foley & Lardner LLP

(57) ABSTRACT

A semiconductor device according to an embodiment includes first to fifth interconnects, first to third memory cells, and a control circuit. The control circuit is configured to execute machine learning. Each of the first memory cells, the second memory cells, and the third memory cells includes a resistance changing element. In the machine learning, the control circuit is configured to: execute a write operation using a common write voltage to each of the second memory cells; and after the write operation, input input data to each of the first interconnects, and change a resistance value of at least one third memory cell of the third memory cells based on the input data and a signal output from each of the fifth interconnects based on the input data.

20 Claims, 18 Drawing Sheets

(58) Field of Classification Search
USPC .................................... 365/189.011, 230.03
See application file for complete search history.

(56) References Cited

U.S. PATENT DOCUMENTS

| | | | |
|---|---|---|---|
| 10,374,011 B2 | 8/2019 | Lee | |
| 10,720,949 B1 | 7/2020 | Rao et al. | |
| 2010/0128512 A1 | 5/2010 | Ohnishi et al. | |
| 2018/0197077 A1 | 7/2018 | Brown et al. | |
| 2019/0190725 A1* | 6/2019 | De | G09C 1/00 |
| 2021/0081771 A1 | 3/2021 | Marukame et al. | |
| 2021/0110249 A1* | 4/2021 | Kale | G06N 3/065 |
| 2021/0263884 A1* | 8/2021 | Nakada | G06N 3/063 |
| 2021/0343352 A1* | 11/2021 | Cho | G11C 16/10 |
| 2022/0366211 A1* | 11/2022 | Ma | G06F 3/0679 |

FOREIGN PATENT DOCUMENTS

| | | |
|---|---|---|
| JP | 4231502 B2 | 3/2009 |
| JP | 2020-181937 A | 11/2020 |
| JP | 2021-047530 A | 3/2021 |
| WO | WO-2021/111573 A1 | 6/2021 |

OTHER PUBLICATIONS

Calderoni, A., et al., "Performance Comparison of O-based and Cu-based ReRAM for High-Density Applications," IEEE, IMW, 2014 (4 pages).

Hassan, A.M., et al., "Hardware Implementation of Echo State Networks using Memristor Double Crossbar Arrays," IEEE, IJCNN, 2017 (7 pages).

* cited by examiner

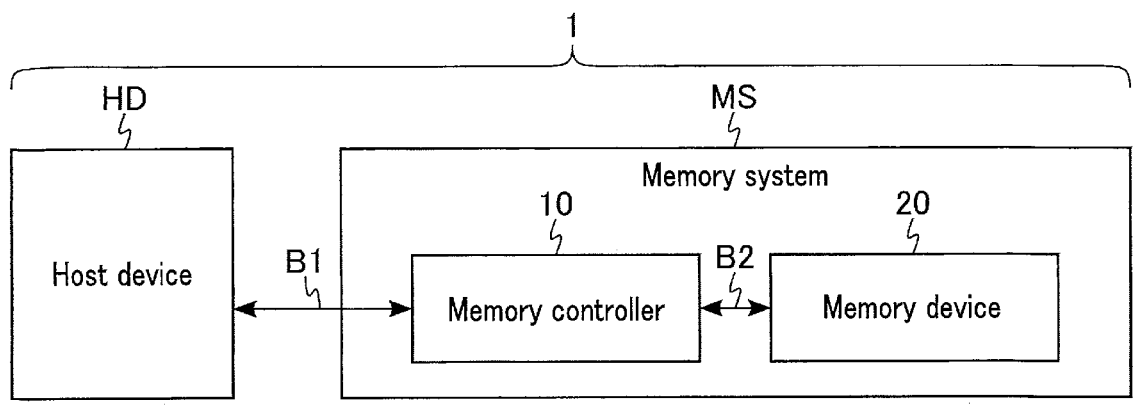
FIG. 4
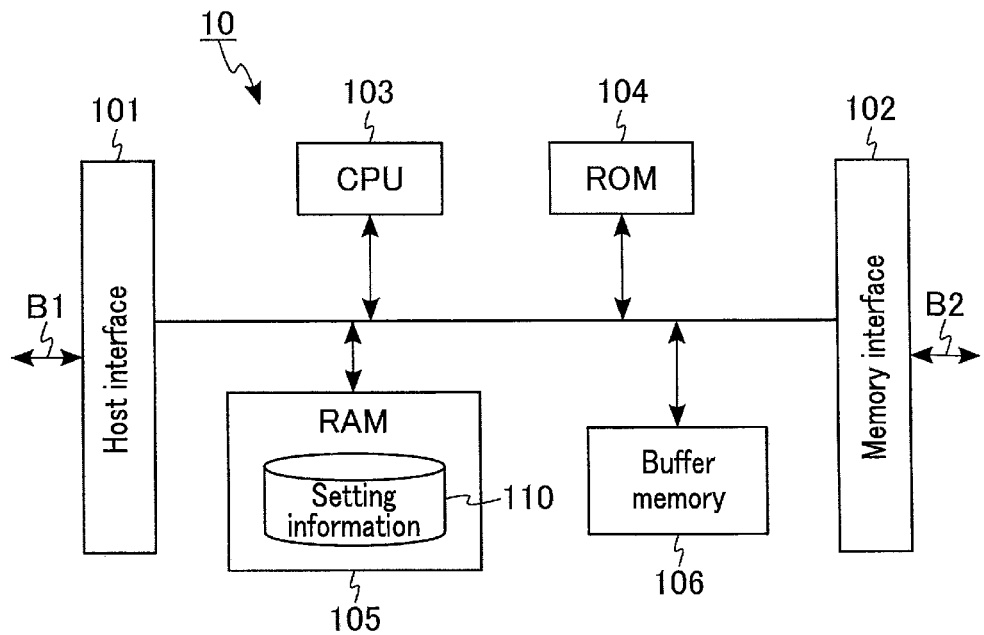
FIG. 5
| Application type | Reservoir size | Reservoir layer setting |
|---|---|---|
| AP1 | 0.2k | RLS1 |
| AP2 | 1k | RLS2 |
| AP3 | 4k | RLS3 |
FIG. 6

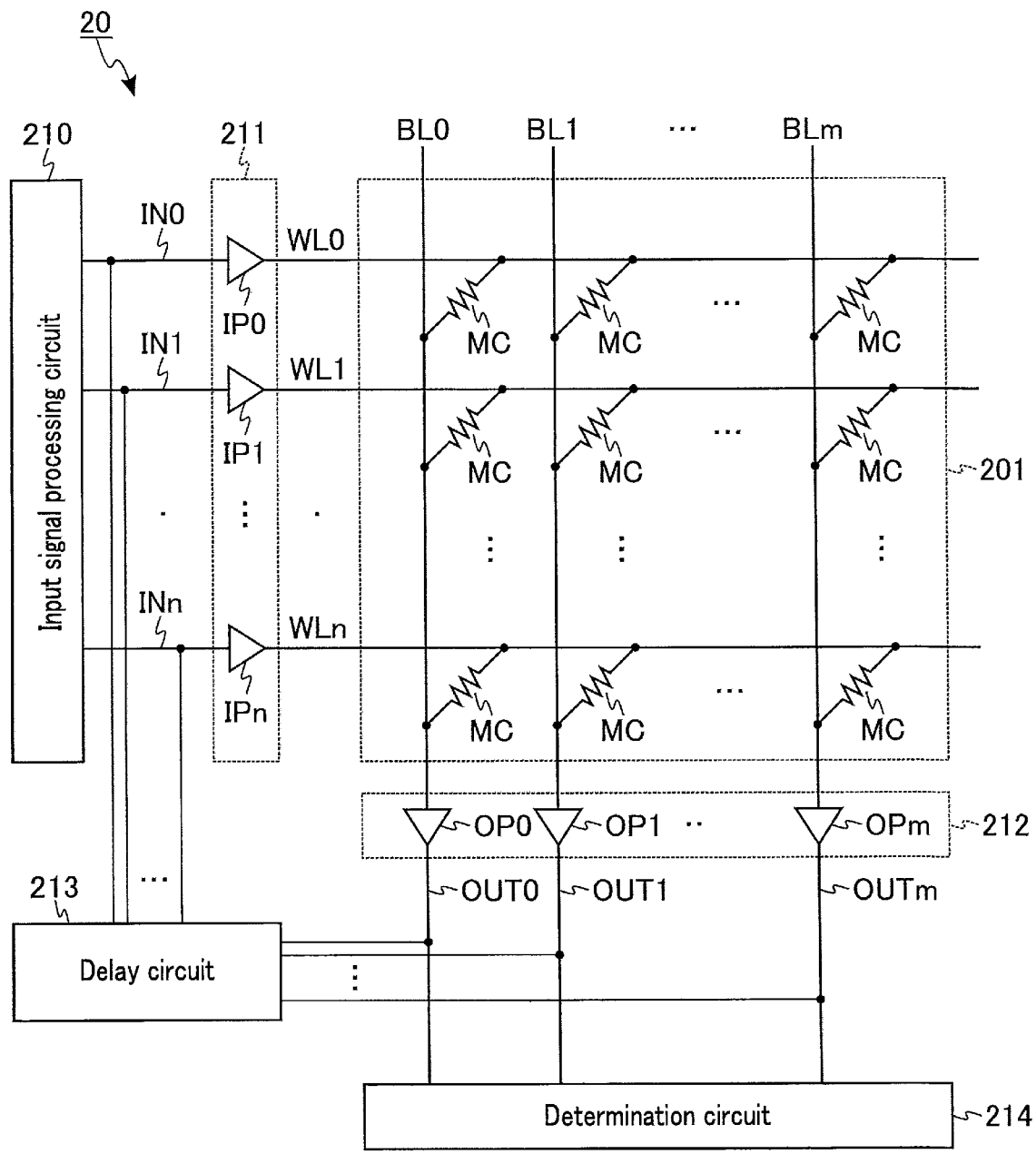
F I G. 8

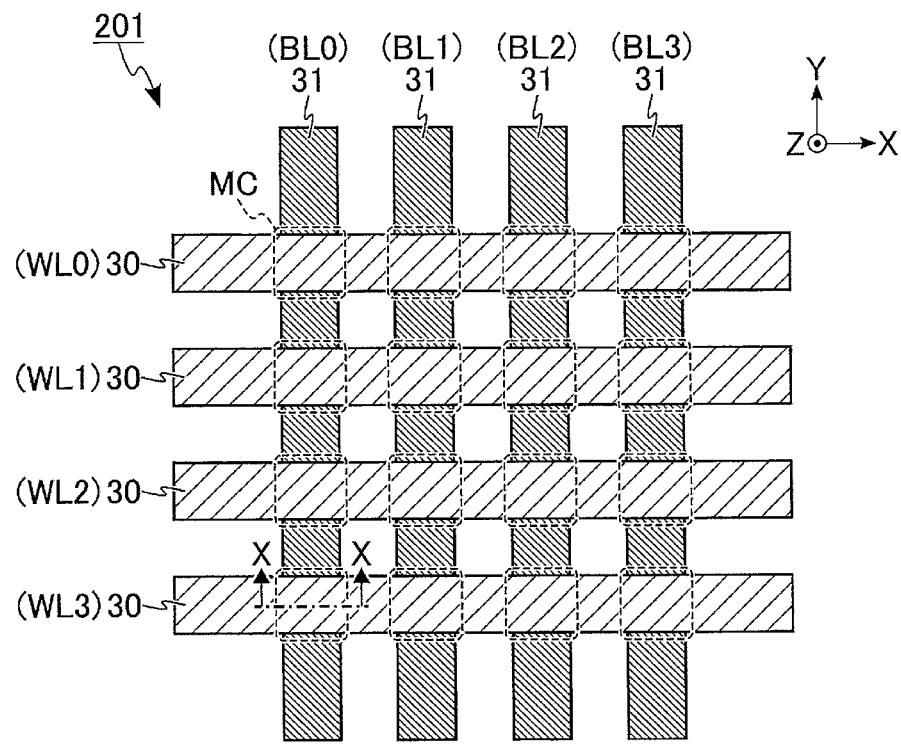
F I G. 9
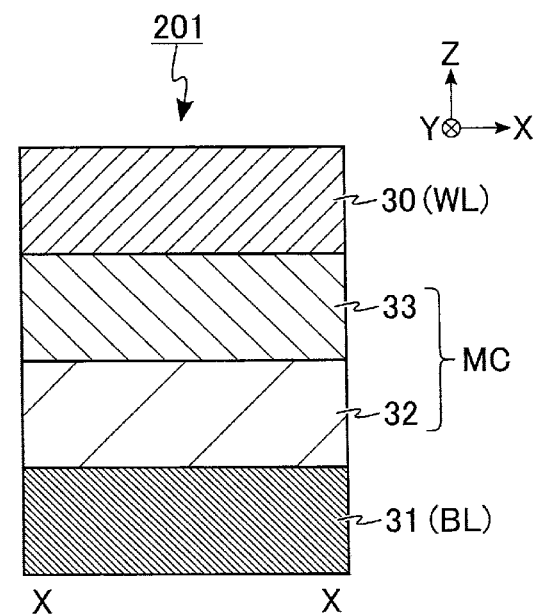
F I G. 10

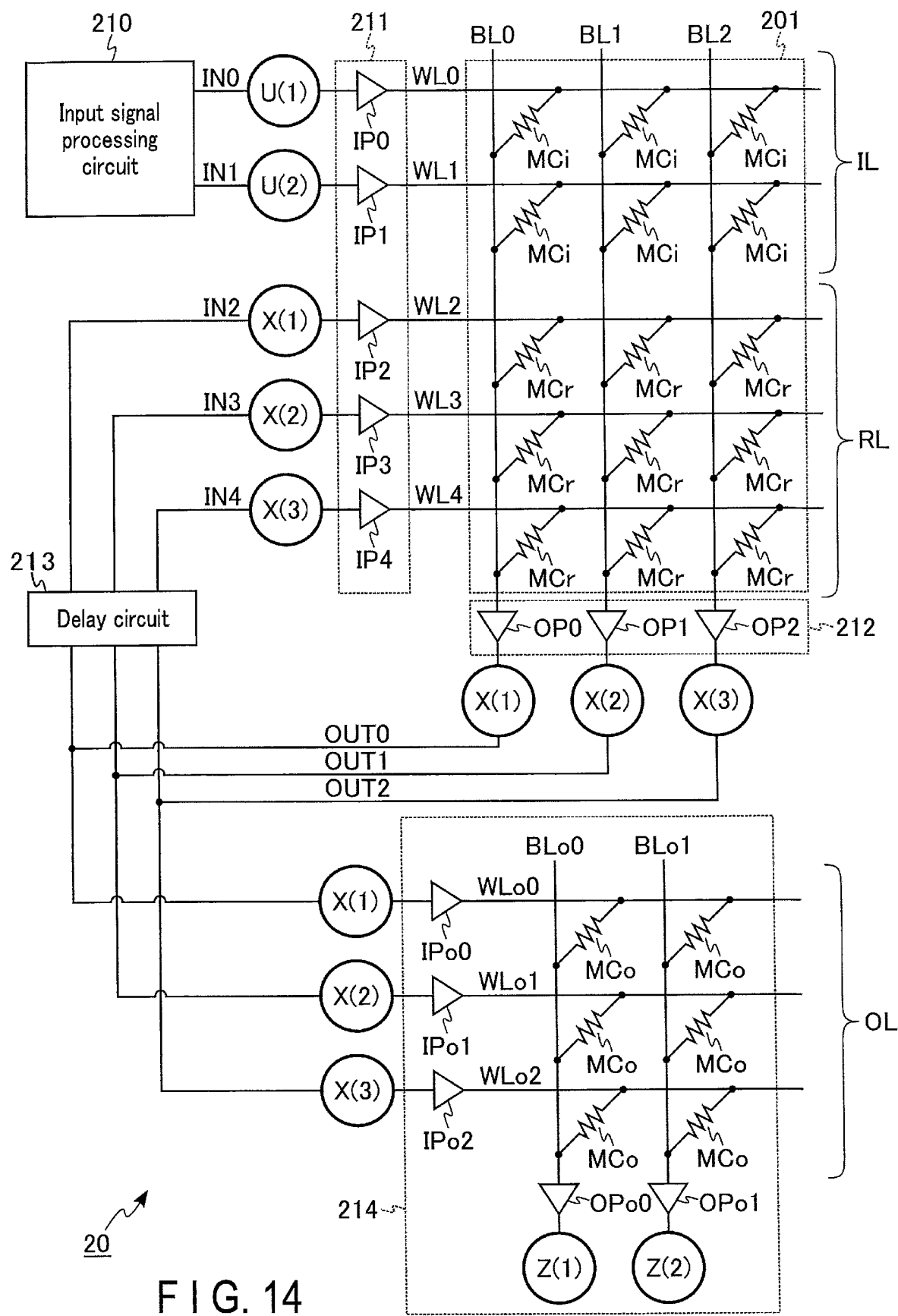
F I G. 14

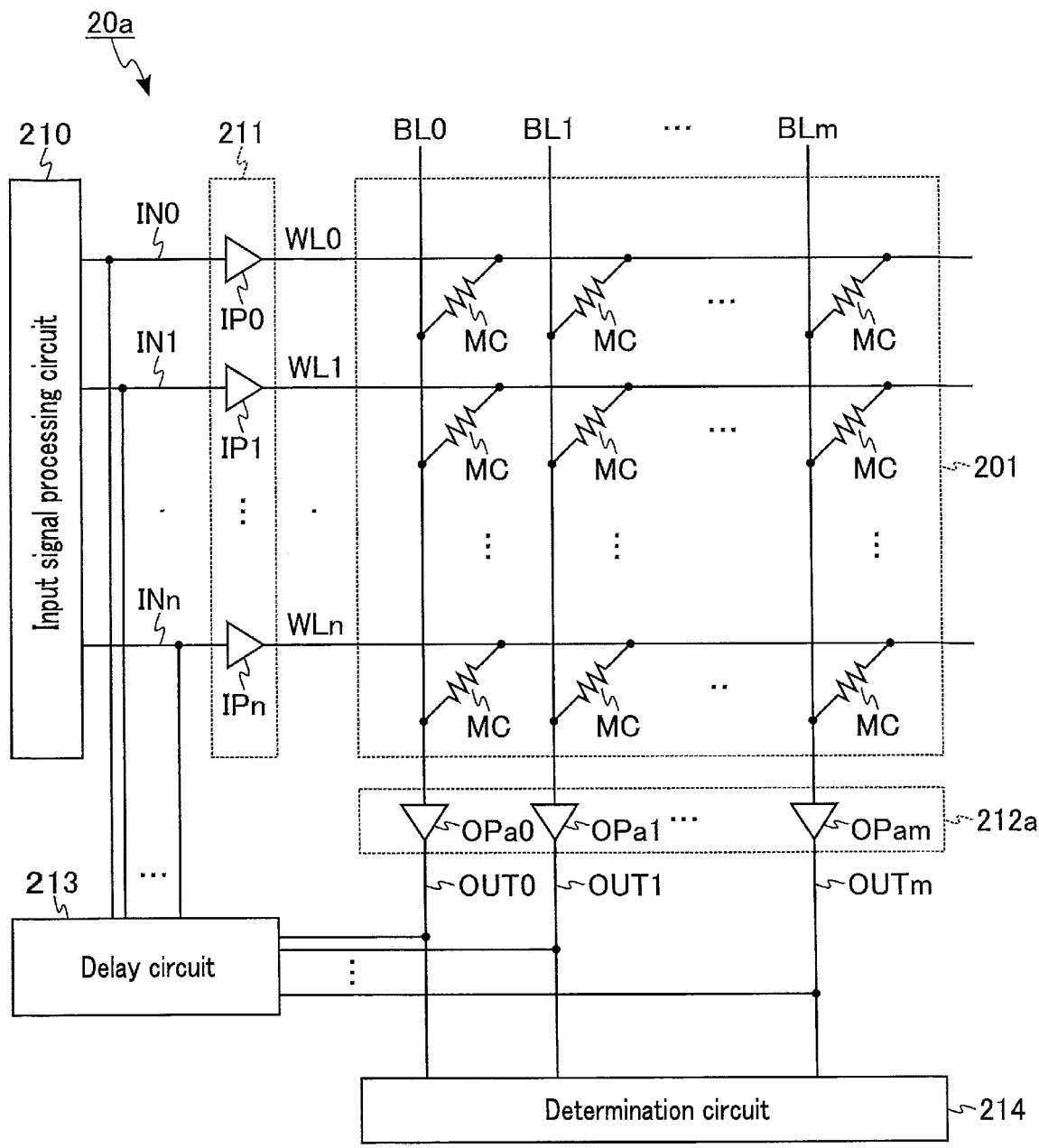
F I G. 16

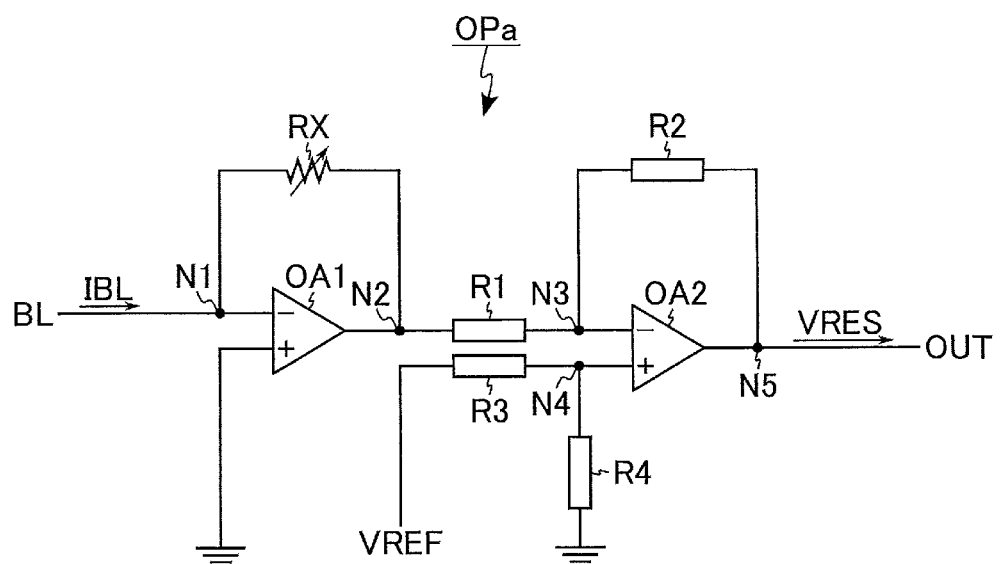
F I G. 17

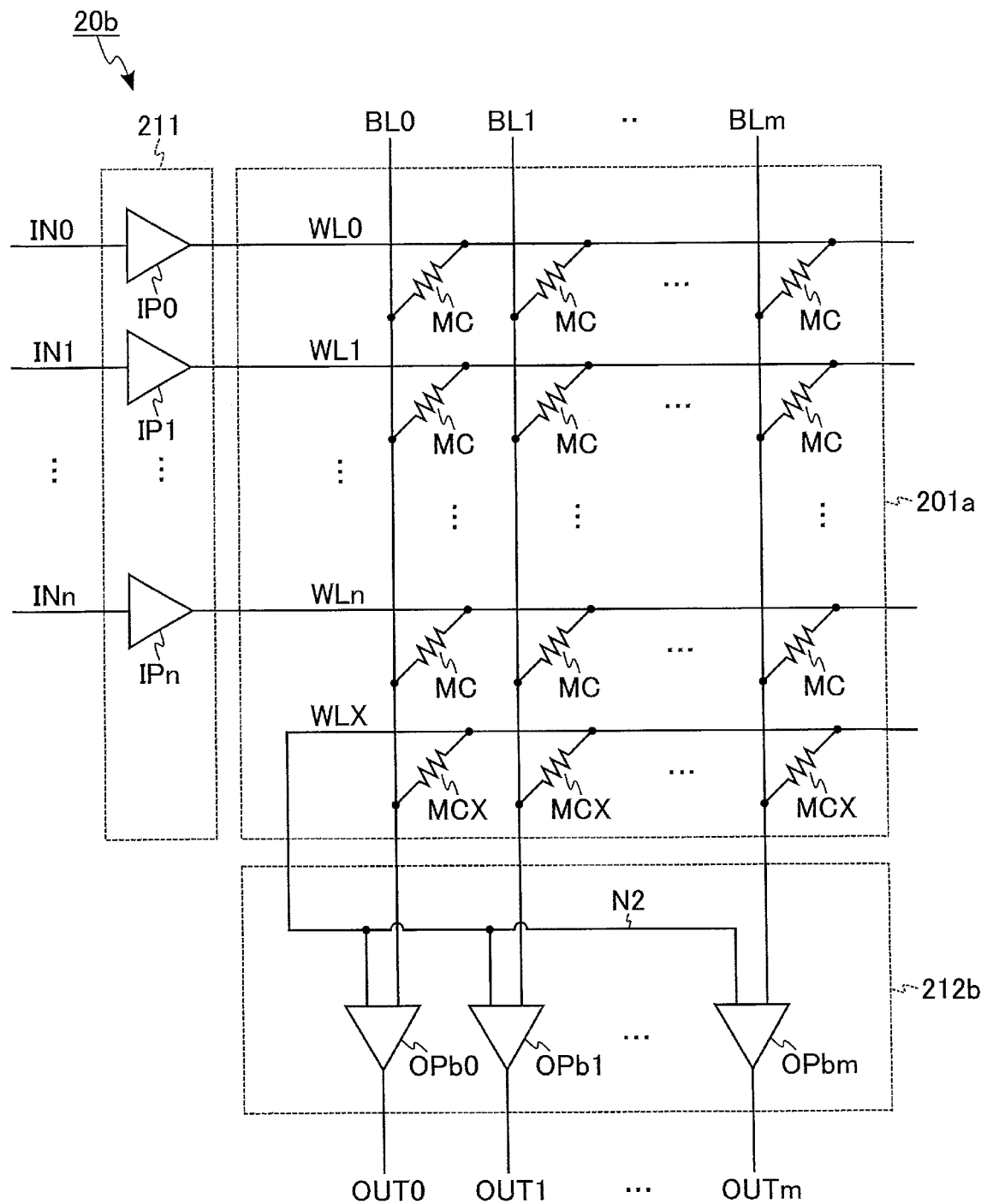
F I G. 19

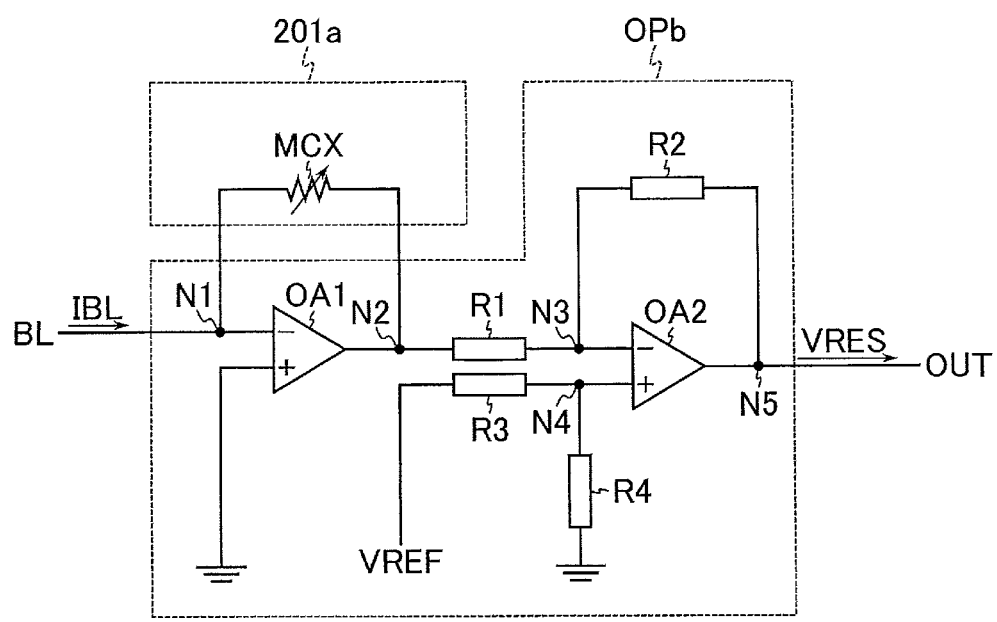
F I G. 20

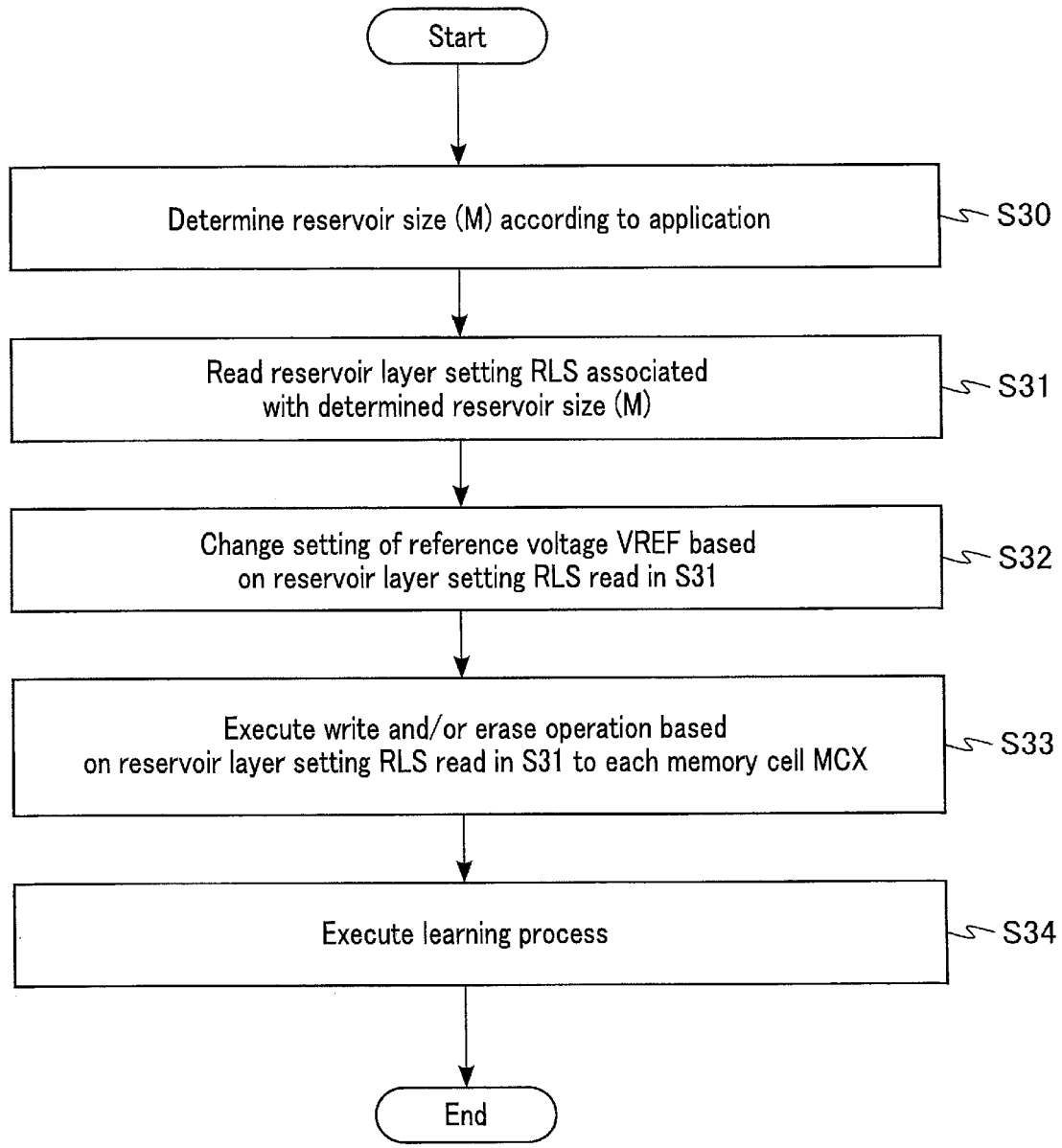
F I G. 21

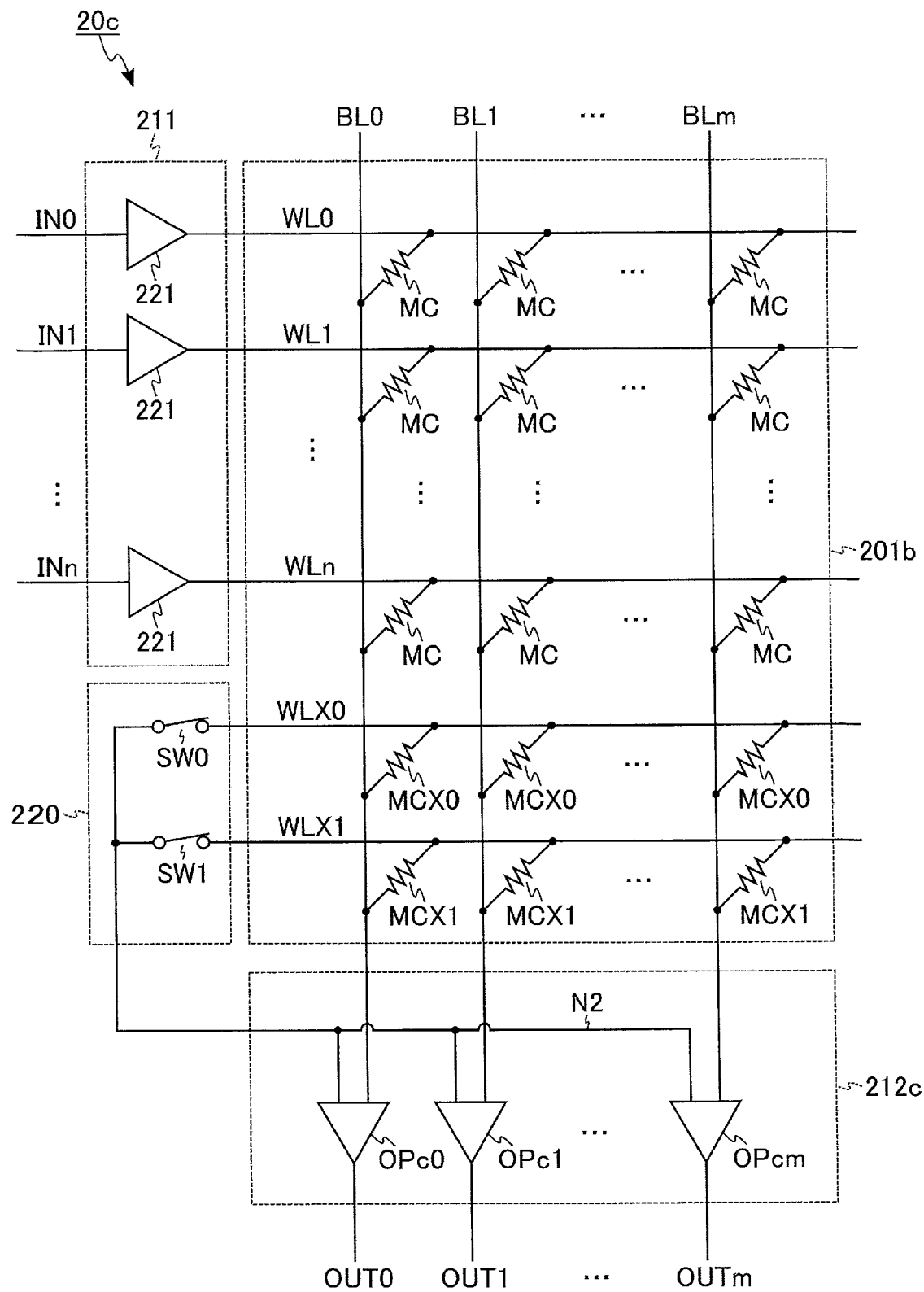
F I G. 22

SEMICONDUCTOR DEVICE

CROSS-REFERENCE TO RELATED APPLICATIONS

This application is based upon and claims the benefit of priority from Japanese Patent Application No. 2022-041171, filed Mar. 16, 2022, the entire contents of which are incorporated herein by reference.

FIELD

Embodiments described herein relate generally to a semiconductor device.

BACKGROUND

A semiconductor device having a cross-point memory cell array capable of storing data in a nonvolatile manner is known. One possible application of such a semiconductor device is to utilize it in reservoir computing, which is a type of machine learning method using recursive neural networks.

BRIEF DESCRIPTION OF THE DRAWINGS

FIG. 4 is a block diagram showing an example of a configuration of an information processing system according to a first embodiment.

FIG. 5 is a block diagram showing an example of a configuration of a memory controller included in a memory system according to the first embodiment.

FIG. 6 is a table showing an example of setting information used in the memory controller included in the memory system according to the first embodiment.

FIG. 8 is a schematic diagram showing an example of a circuit configuration of a memory cell array and a configuration of some peripheral circuits, in the memory device included in the memory system according to the first embodiment.

FIG. 9 is a plan view showing an example of a planar layout of the memory cell array in the memory device included in the memory system according to the first embodiment.

FIG. 10 is a cross-sectional view taken along line X-X in FIG. 9, showing an example of a cross-sectional structure of the memory cell array in the memory device included in the memory system according to the first embodiment.

FIG. 14 is a schematic diagram showing an example of assignment of functions of the memory device in a learning operation of the memory system according to the first embodiment.

FIG. 16 is a schematic diagram showing an example of a circuit configuration of a memory cell array and a configuration of some peripheral circuits, in a memory device included in a memory system according to a second embodiment.

FIG. 17 is a circuit diagram showing an example of a circuit configuration of an output unit in the memory device included in the memory system according to the second embodiment.

FIG. 19 is a schematic diagram showing an example of a circuit configuration of a memory cell array and configurations of an input circuit and an output circuit, in a memory device included in a memory system according to a third embodiment.

FIG. 20 is a circuit diagram showing an example of a circuit configuration of an output unit in the memory device included in the memory system according to the third embodiment.

FIG. 21 is a flowchart showing an example of a flow of a learning operation of the memory system according to the third embodiment.

FIG. 22 is a schematic diagram showing an example of a circuit configuration of a memory cell array and configurations of an input circuit and an output circuit, in a memory device included in a memory system according to a fourth embodiment.

DETAILED DESCRIPTION

Figure 1:
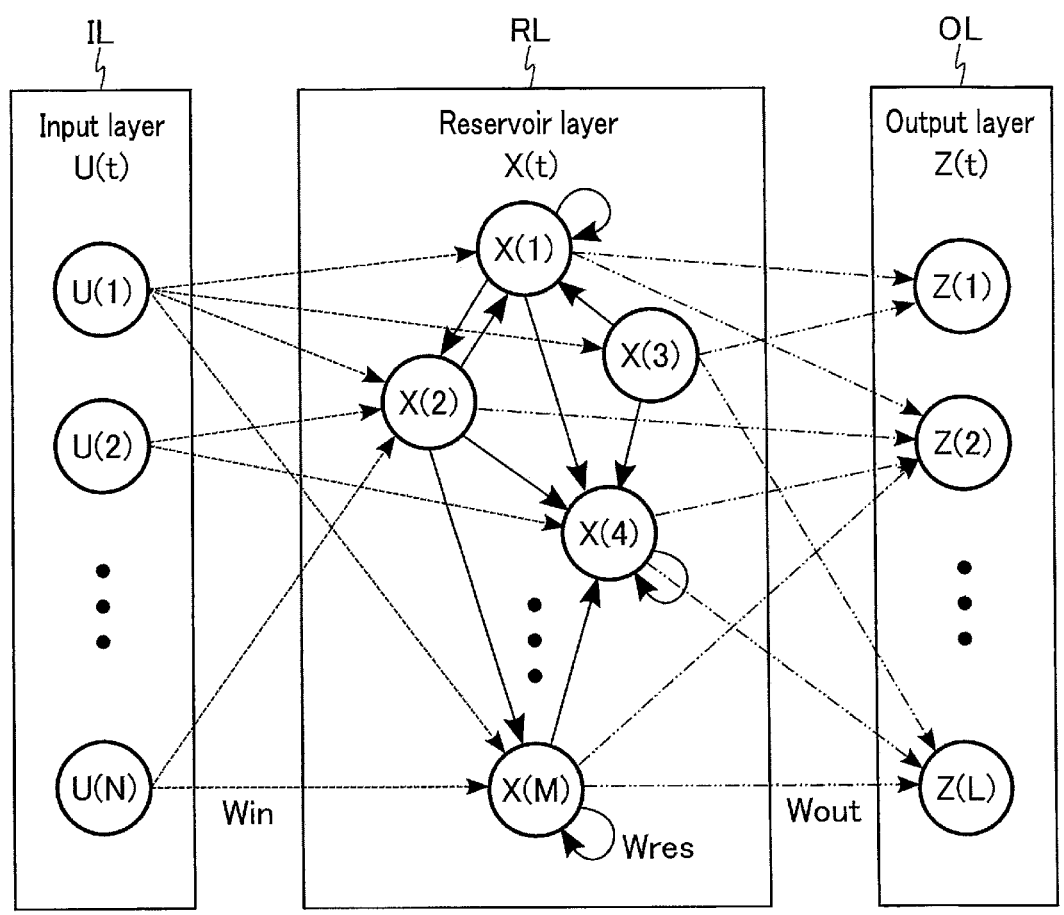
FIG. 1 is a conceptual diagram showing an example of a functional configuration of reservoir computing.

In general, according to one embodiment, a semiconductor device includes a plurality of first interconnects, a plurality of second interconnects, a plurality of first memory cells, a plurality of third interconnects, a plurality of second memory cells, a plurality of fourth interconnects, a plurality of fifth interconnects, a plurality of third memory cells, and a control circuit. The second interconnects intersect the first interconnects. The first memory cells are respectively provided at intersections between the first interconnects and the second interconnects. Each of the first memory cells is coupled between one of the first interconnects and one of the second interconnects. The third interconnects intersect the second interconnects. The third interconnects are respectively coupled to the second interconnects via a delay circuit. The second memory cells are respectively provided at intersections between the third interconnects and the second interconnects. Each of the second memory cells is coupled between one of the third interconnects and one of the second interconnects. The fourth interconnects are respectively coupled to the second interconnects. The fifth interconnects intersects the fourth interconnects. The third memory cells are respectively provided at intersections between the fourth interconnects and the fifth interconnects. Each of the third memory cells is coupled between one of the fourth interconnects and one of the fifth interconnects. The control circuit is configured to execute machine learning. Each of the first memory cells, the second memory cells, and the third memory cells includes a resistance changing element. In the machine learning, the control circuit is configured to: execute a write operation using a common write voltage to each of the second memory cells; and after the write operation, input input data to each of the first interconnects, and change a resistance value of at least one third memory cell of the third memory cells based on the input data and a signal output from each of the fifth interconnects based on the input data.

Hereinafter, embodiments will be described with reference to the drawings. Each embodiment illustrates a device and a method for embodying the technical idea of the invention. The drawings are either schematic or conceptual. The dimensions, ratios, etc. used in the drawings are not necessarily the same as those of the actual products. In this specification, structural components having approximately the same function and configuration will be denoted by the same reference sign. The numbers, etc. added to the reference signs are used to distinguish between elements that are referenced by the same reference sign and have a similar configuration.

[0] Reservoir Computing

First, an outline of reservoir computing will be described. FIG. 1 is a conceptual diagram showing an example of a functional configuration of reservoir computing. As shown in FIG. 1, the reservoir computing includes an input layer IL, a reservoir layer RL, and an output layer OL.

The input layer IL is a set of input nodes in the reservoir computing. An input signal is input to each node of the input layer IL. As the input signal, time-series data may be used. Specifically, sample-by-sample units of sampled time-series data are sequentially input to the input layer IL. When N ("N" is an integer of 1 or more) nodes are allocated to the input layer IL, the input layer IL has nodes U(1), U(2), ..., and U(N).

The reservoir layer RL is a reservoir in the reservoir computing, and corresponds to a recursive neural network having random bonds. A signal output from each node of the reservoir layer RL is an analog signal. When M ("M" is an integer of 2 or more) nodes are allocated to the reservoir layer RL, the reservoir layer RL has nodes X(1), X(2), X(3), X(4), ..., and X(M).

The output layer OL is a set of output nodes in the reservoir computing. Each node of the output layer OL corresponds to a preset target value (i.e., an answer). A signal output from each node of the output layer OL is an analog signal. In the reservoir computing, a degree of association between an input signal and a target value is determined based on the magnitude of an output of each node of the output layer OL. When L ("L" is an integer of 2 or more) nodes are allocated to the output layer OL, the output layer OL has nodes Z(1), Z(2), ..., and Z(L).

Each arrow shown in FIG. 1 indicates a bond between nodes and a weight. Specifically, a dashed arrow in FIG. 1 indicates a bond between a node U(t) ("t" is a natural number) of the input layer IL and a node X(t) of the reservoir layer RL. A solid arrow in FIG. 1 indicates a bond between two nodes X(t) within the reservoir layer RL. A two-dot chain arrow in FIG. 1 indicates a bond between a node X(t) of the reservoir layer RL and a node Z(t) of the output layer OL. In FIG. 1, illustration of a bond between nodes is appropriately omitted.

The node U(t) of the input layer IL is, for example, bonded to each of the nodes X(1) to X(M). The bond between a node U(t) and a node X(t) has a weight Win. The node X(t) of the reservoir layer RL is, for example, bonded to each of the nodes X(1) to X(M). That is, the node X(t) of the reservoir layer RL may have a portion bonded to itself. The bond between two nodes X(t) has a weight Wres. In addition, the node X(t) of the reservoir layer RL is, for example, bonded to each of the nodes Z(1) to Z(L) of the output layer OL. The bond between a node X(t) and a node Z(t) has a weight Wout.

The magnitude of each of Win, Wres, and Wout may differ for each bond. Machine learning by the reservoir computing fixes each of Win and Wres, and changes Wout by training. That is, the reservoir computing creates a (trained) model by training and optimizing Wout by machine learning. The amount of training of the reservoir computing is less than that of a recursive neural network, which is a scheme that requires training of a weight of an intermediate layer. Further, in the reservoir computing, the accuracy of a learning result can vary depending on a size of the reservoir layer RL and the magnitude of weight variation in the reservoir layer RL.

Hereinafter, an operation of creating a trained model will be referred to as a "learning operation" or "machine learning". The size of the reservoir layer RL will be referred to as a "reservoir size". In this specification, the reservoir size corresponds to the number of nodes X(t) of the reservoir layer RL. The numbers of nodes U(t) of the input layer, nodes X(t) of the reservoir layer RL, and nodes Z(t) of the output layer OL may be changed as appropriate according to a learning target.

Figure 2:
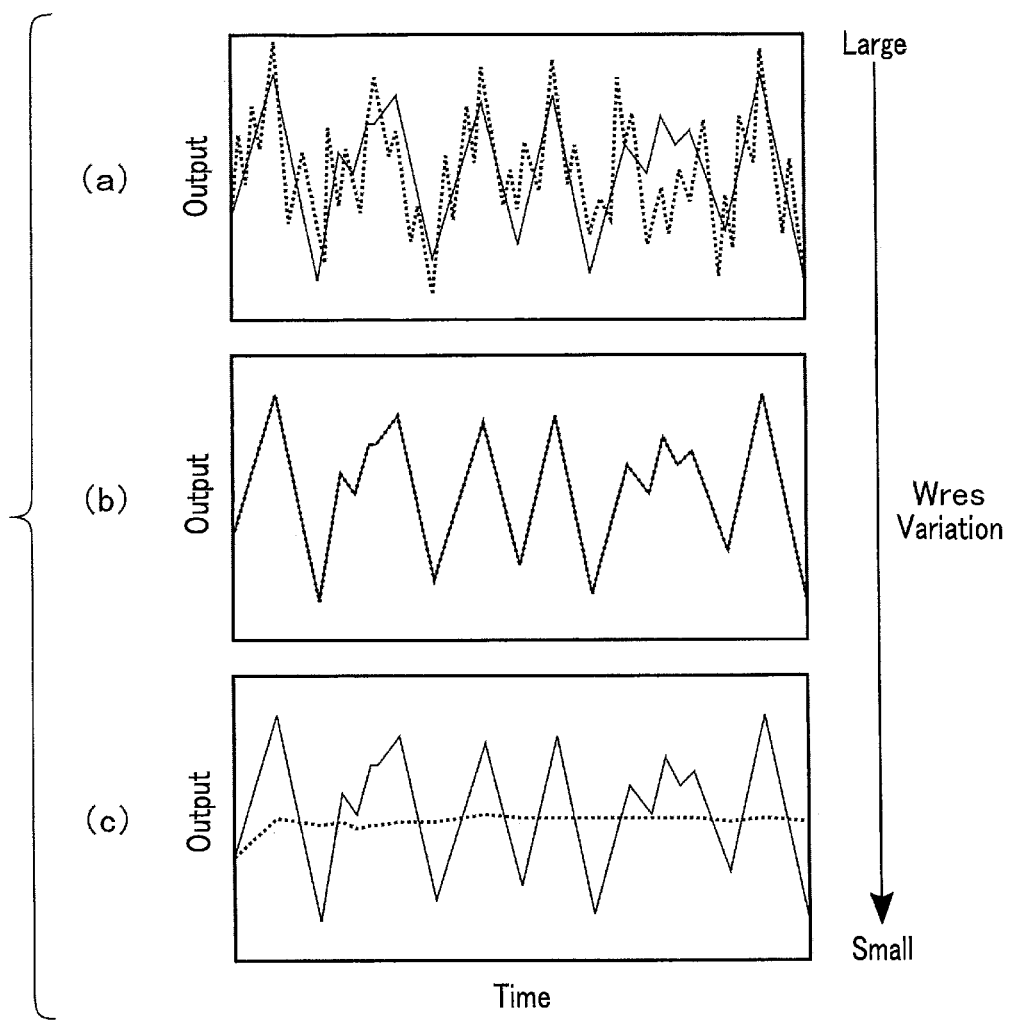
FIG. 2 is a graph showing an example of an evaluation result of the reservoir computing.

FIG. 2 is a graph showing an example of an evaluation result of the reservoir computing. FIG. 2 shows time-series data (a solid line in each graph of FIG. 2) of a learning target, and three types of learning results (a dashed line in each graph of FIG. 2) created based on that time-series data. In these graphs, an abscissa axis represents time, and an ordinate axis represents an output. A variation in the weight Wres of the reservoir layer RL used for learning is set in such a manner as to decrease in the order of (a), (b), and (c) of FIG. 2. FIG. 2 (*b*) corresponds to a case in which an optimal value of the variation in Wres is utilized.

If the variation in Wres is too much larger than the optimal value, a plurality of bonds in the reservoir layer RL will contain bonds with a large Wres. In this case, there is a concern that signal modulation by Win may become unadjustable due to signal amplification in the reservoir layer RL. As a result, an error in a learning result can become large, as shown in FIG. 2 (*a*). If the variation in Wres is too much smaller than the proper value, there is a concern that the reservoir computing may fail in learning as shown in FIG. 2 (*c*). In contrast, if the variation in Wres is appropriate, the accuracy of the learning result may become high as shown in FIG. 2 (*b*). In this way, the learning performance of the reservoir computing is affected by the weight variation in Wres. Thus, in the reservoir computing, it is preferable that the weight variation in Wres in the reservoir layer RL be appropriately set.

Figure 3:
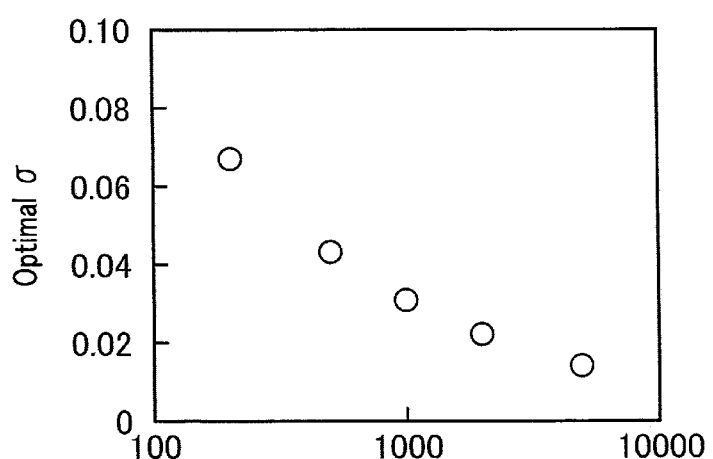
FIG. 3 is a graph showing an example of a relationship between a reservoir size and an optimal weight variation of a reservoir layer in the reservoir computing.

FIG. 3 is a graph showing an example of a relationship between a reservoir size and an optimal weight variation of the reservoir layer RL in the reservoir computing. In this graph, an abscissa axis indicates the reservoir size, and an ordinate axis indicates a magnitude of the optimal weight variation. Hereinafter, the magnitude of the optimal weight variation will also be referred to as an "optimal σ (standard deviation)".

As shown in FIG. 3, the optimal σ depends on the reservoir size. Specifically, in this example, the optimal σ tends to decrease as the reservoir size increases. In this way, the optimal σ of the reservoir layer RL in the reservoir computing may be calculated based on the reservoir size.

[1] First Embodiment

An information processing system 1 according to a first embodiment executes a learning operation based on reservoir computing by using a semiconductor device having a cross-point memory cell array. The semiconductor device then executes a write operation with respect to each memory cell in a memory area allocated to a reservoir layer RL according to a reservoir size to bring the magnitude of a weight variation of the reservoir layer RL closer to an optimal σ. Details of the information processing system 1 according to the first embodiment will be described below.

[1-1] Configuration

[1-1-1] Overall Configuration of Information Processing System 1

FIG. 4 is a block diagram showing an example of a configuration of the information processing system 1 according to the first embodiment. As shown in FIG. 4, the information processing system 1 includes, for example, a host device HD and a memory system MS. The host device HD is an electronic device, such as a personal computer, a portable information terminal, and a server. The memory system MS is a semiconductor device capable of executing machine learning using reservoir computing.

The memory system MS may determine the type of input time-series data based on a trained model that is created by a learning operation using supervised data. The "supervised data" is data including a combination of time-series data used in machine learning and an answer (type) thereof. The memory system MS includes a memory controller 10 and a memory device 20. The memory controller 10 is coupled to the host device HD via a host bus B1. The memory device 20 is coupled to the memory controller 10 via a memory bus B2.

The memory controller 10 is, for example, a semiconductor integrated circuit formed as an SoC (System on a Chip). The memory controller 10 controls the memory device 20 based on an order received from the host device HD. For example, the memory controller 10 may execute a read operation, a write operation, an erase operation, etc., based on an order from the host device HD. Further, the memory controller 10 may execute a learning operation based on supervised data and an instruction to execute a learning operation received from the host device HD.

The memory device 20 is a semiconductor storage device having a cross-point memory cell array capable of storing data in a nonvolatile manner. The memory device 20 is, for example, a type of variable resistance memory using a ferroelectric tunnel junction (FTJ) element as a memory cell. The memory device 20 includes memory areas that may be used as the input layer IL, reservoir layer RL, and output layer OL in the reservoir computing.

[1-1-2] Configuration of Memory Controller 10

FIG. 5 is a block diagram showing an example of a configuration of the memory controller 10 included in the memory system MS according to the first embodiment. As shown in FIG. 5, the memory controller 10 includes, for example, a host interface 101, a memory interface 102, a central processing unit (CPU) 103, a read only memory (ROM) 104, a random access memory (RAM) 105, and a buffer memory 106.

The host interface 101 is a hardware interface in accordance with an interface standard between the host device HD and the memory controller 10. The host interface 101 is coupled to the host device HD via the host bus B1.

The memory interface 102 is a hardware interface in accordance with an interface standard between the memory controller 10 and the memory device 20. The memory interface 102 is coupled to the memory device 20 via the memory bus B2.

The CPU 103 is a processor that controls the operation of the entire memory controller 10. The CPU 103 transmits instructions to read, write, and erase to the memory device 20 via the memory interface 102 according to requests to read, write, and erase received via the host interface 101. Further, the CPU 103 transmits an operation instruction related to a learning operation to the memory device 20 via the memory interface 102 according to an instruction to execute the learning operation received via the host interface 101.

The ROM 104 is a nonvolatile memory. The ROM 104 stores, for example, a program such as firmware. An operation of the memory controller 10 is realized by firmware being executed by the CPU 103.

The RAM 105 is a volatile memory. The RAM 105 is used as a working area of the CPU 103. The RAM 105 may store setting information 110. The setting information 110 is information on settings of the memory device 20 used in a learning operation.

The buffer memory 106 is, for example, a volatile memory. The buffer memory 106 temporarily stores data received via the host interface 101 and data received via the memory interface 102. Further, the buffer memory 106 may store supervised data related to machine learning and time-series data such as data to be predicted using a trained model.

(Configuration of Setting Information 110)

FIG. 6 is a table showing an example of the setting information 110 used in the memory controller 10 included in the memory system MS according to the first embodiment. As shown in FIG. 6, the setting information 110 includes information in which an application type, a reservoir size, and a reservoir layer setting are associated.

The application type corresponds to a group of time-series data for which execution of machine learning is requested from the host device HD. The host device HD may set an application type for each application to be executed or each instance of processing within an application to be executed. The reservoir size corresponds to a capacity of the reservoir layer RL, and corresponds to the size of a memory area to be assigned to the memory device 20 in a learning operation. The reservoir layer setting is a set of parameters related to setting of a weight variation of the reservoir layer RL in machine learning when execution of that machine learning is requested from the host device HD.

In this example, AP1, AP2, and AP3 are set as the application types. For the application type AP1, reservoir size=0.2k and reservoir setting RLS1 are assigned. For the application type AP2, reservoir size=1k and reservoir setting RLS2 are assigned. For the application type AP3, reservoir size=4k and reservoir setting RLS3 are assigned.

The number of application types, reservoir size settings, etc. managed by the setting information 110 may be other values. If a reservoir size is specified by the host device HD, the memory controller 10 may select a reservoir layer setting according to the specified reservoir size. In this case, a range of reservoir sizes are associated with the reservoir layer setting.

[1-1-3] Configuration of Memory Device 20

Figure 7:
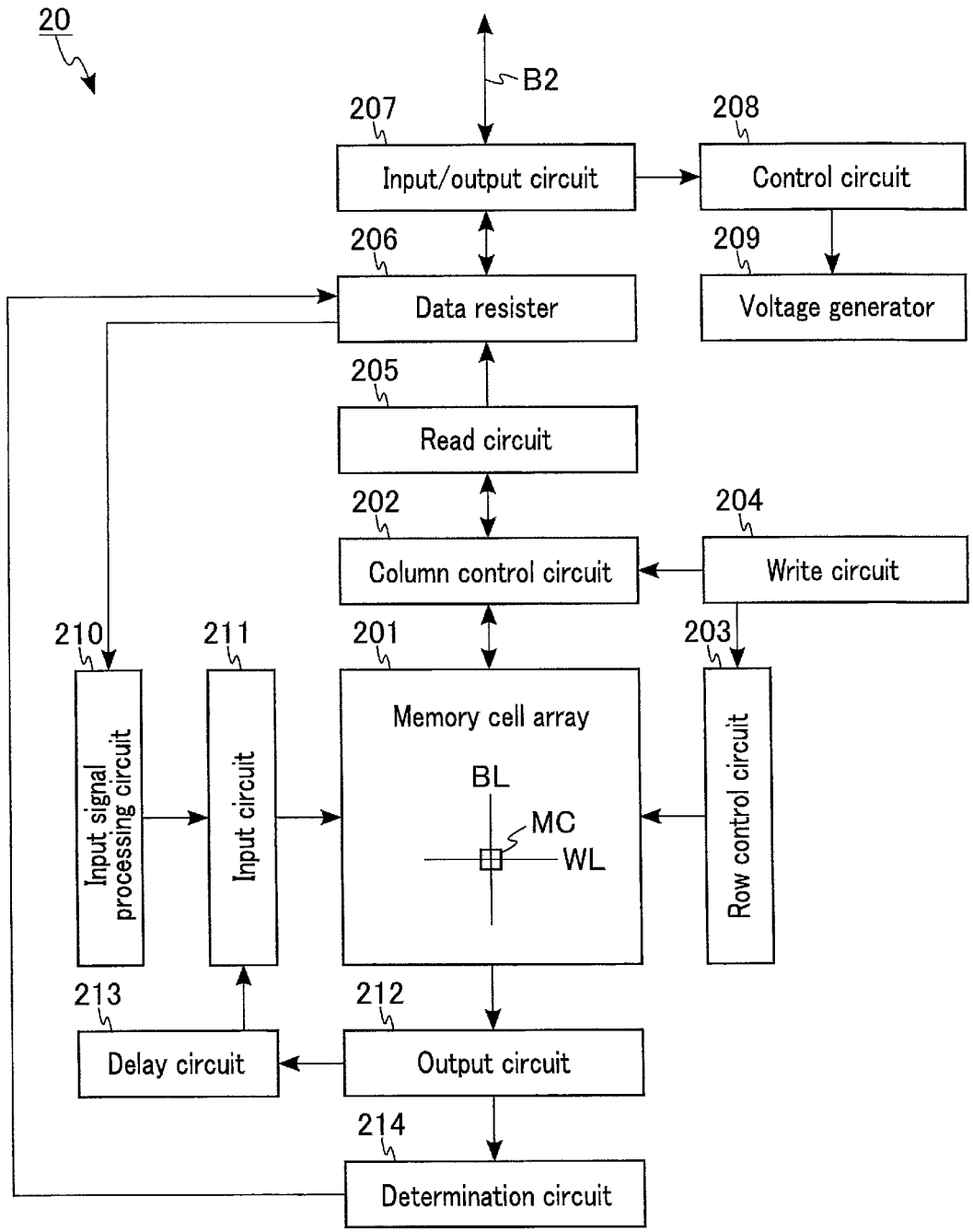
FIG. 7 is a block diagram showing an example of a configuration of a memory device included in the memory system according to the first embodiment.

FIG. 7 is a block diagram showing a configuration example of the memory device 20 included in the memory system MS according to the first embodiment. As shown in FIG. 7, the memory device 20 includes, for example, a memory cell array 201, a column control circuit 202, a row control circuit 203, a write circuit 204, a read circuit 205, a data register 206, an input/output circuit 207, a control circuit 208, a voltage generator 209, an input signal processing circuit 210, an input circuit 211, an output circuit 212, a delay circuit 213, and a determination circuit 214.

The memory cell array 201 includes a plurality of memory cells MC, a plurality of word lines WL, and a plurality of bit lines BL. FIG. 7 shows a set of a memory cell MC, a word line WL, and a bit line BL. The memory cell MC includes a resistance changing element, and has a rectifying function. The memory cell MC may store data based on a resistance value. For example, the memory cell MC stores "1" data when it is in a high resistance state, and stores "0" data when it is in a low resistance state. The allocation of data to the resistance value of the memory cell MC may be set in a different way. The memory cell MC is coupled between a single word line WL and a single bit line BL, and is associated with a set of a row and a column. A row address is assigned to the word line WL. A column address is assigned to the bit line BL. One or more memory cells MC may be specified by selection of one row and selection of one or more columns. The memory cell array 201 has memory areas corresponding to the input layer IL and the reservoir layer RL used for machine learning. In such memory areas, the resistance value of the memory cell MC corresponds to a weight in reservoir computing. In other words, the magnitude of a current flowing through the memory cell MC is used as a weight in reservoir computing.

The column control circuit 202 is coupled to a plurality of bit lines BL. Then, the column control circuit 202 may select one or more bit lines BL specified by a column address. The column control circuit 202, for example, electrically couples the selected bit line BL, and the write circuit 204 or the read circuit 205.

The row control circuit 203 is coupled to a plurality of word lines WL. The row control circuit 203 selects one or more word lines WL specified by a row address. The row control circuit 203, for example, electrically couples the selected word line WL, and the write circuit 204 or the read circuit 205.

The write circuit 204 includes a driver capable of generating a voltage used in a write operation. The write operation is an operation that changes the resistance value of the memory cell MC by applying a forward or reverse current to the memory cell MC. The write circuit 204 supplies voltages used in the write operation to the column control circuit 202 and the row control circuit 203, respectively. Further, the write circuit 204 may supply voltages used in the write operation to the column control circuit 202 and the row control circuit 203 based on data requested to be written.

The read circuit 205 includes a sense amplifier used for determining data in a read operation. The read operation is an operation to determine whether the resistance value of the memory cell MC exceeds a predetermined value, that is, whether the memory cell MC stores "0" data or "1" data. The read circuit 205 may supply a voltage used for reading data to the column control circuit 202. The sense amplifier may determine data stored in the memory cell MC based on a voltage or current of the selected bit line BL. The read circuit 205 may transfer data corresponding to a determination result to the data register 206.

The data register 206 is a memory circuit that temporarily stores data. The data register 206 stores, for example, data to be written to the memory cell array 201, data read from the memory cell array 201, supervised data used in machine learning, or data to be predicted using a trained model. The supervised data and time-series data are transferred to the input signal processing circuit 210. Further, the data register 206 may store data corresponding to a determination result based on a machine learning model formed in the memory device 20.

The input/output circuit 207 is coupled to the memory controller 10 via the memory bus B2. The input/output circuit 207 manages communications between the memory device 20 and the memory controller 10. Specifically, the input/output circuit 207 transfers a command (instruction) received from the memory controller 10 to the control circuit 208. The input/output circuit 207 transfers a column address and a row address included in an address signal received from the memory controller 10 to the column control circuit 202 and the row control circuit 203, respectively. The input/output circuit 207 transfers data received from the memory controller 10 to the data register 206.

The control circuit 208 controls the operation of the entire memory device 20. For example, the control circuit 208 controls each structural element within the memory device 20 based on a command transferred from the memory controller 10, and executes a read operation, a write operation, an erase operation, etc. The control circuit 208 can also execute machine learning based on supervised data received from the memory controller 10, allocation of each of the input layer IL, reservoir layer RL, and output layer OL, and reservoir layer setting.

The voltage generator 209 is a set of drivers that generate voltages used in various operations of the memory device 20. For example, the voltage generator 209 supplies voltages to the write circuit 204, read circuit 205, input circuit 211, output circuit 212, determination circuit 214, etc. based on control by the control circuit 208.

The input signal processing circuit 210 transfers data related to machine learning to the input circuit 211. Specifically, the input signal processing circuit 210 transfers supervised data transferred from the data register 206 and data to be predicted using a trained model to the input circuit 211.

The input circuit 211 amplifies a signal transferred from the input signal processing circuit 210, and transfers the signal to a memory area corresponding to the input layer IL of the memory cell array 201. Further, the input circuit 211 amplifies or attenuates a signal transferred from the delay circuit 213, and transfers the signal to the memory area corresponding to the reservoir layer RL of the memory cell array 201.

The output circuit 212 IV (current-to-voltage) converts and amplifies a signal transferred via the bit line BL associated with each of the input layer IL and the reservoir layer RL of the memory cell array 201, and transfers the signal to each of the delay circuit 213 and the determination circuit 214.

The delay circuit 213 delays the signal transferred from the output circuit 212, and transfers the delayed signal to the input circuit 211. A delay time of the signal by the delay circuit 213 is set, for example, based on a sampling timing of time-series data input to the memory cell array 201.

The determination circuit 214 includes a memory cell array with a memory area corresponding to the output layer OL and a control circuit for this memory cell array. A weight (resistance value) of each memory cell included in the memory cell array of the determination circuit 214 may be changed as appropriate in the process of a learning operation. Then, the determination circuit 214 determines the type of data by performing output layer OL processing on the signal received from the output circuit 212, and transfers a determination result to the data register 206.

The memory cell array 201 may have both a memory area that stores data as "0" or "1" and memory areas used as the input layer IL and the reservoir layer RL, or may have only the memory areas used as the input layer IL and the reservoir layer RL. The memory cell array 201 and the determination circuit 214 may be created together on the same substrate.

(Circuit Configuration of Memory Device 20 and Configurations of Peripheral Circuits)

Details of a circuit configuration of the memory device 20 and configurations of peripheral circuits will be described. In this specification, the "peripheral circuits" are configurations related to machine learning, and refer to a set of the input signal processing circuit 210, input circuit 211, output circuit 212, delay circuit 213, and determination circuit 214.

FIG. 8 is a schematic diagram showing an example of a circuit configuration of the memory cell array 201 and a configuration of some of the peripheral circuits, in the memory device 20 included in the memory system MS according to the first embodiment. As shown in FIG. 8, the memory cell array 201 includes word lines WL0 to WLn ("n" is an integer of 1 or more), bit lines BL0 to BLm ("m" is an integer of 1 or more), and a plurality of memory cells MC. The plurality of word lines WL and the plurality of bit lines BL intersect each other. One memory cell MC is coupled to an intersection of a single word line WL and a single bit line BL.

The input circuit 211 includes input units IP0 to IPn. Input nodes of the input units IP0 to IPn are coupled to nodes IN0 to INn, respectively. Output nodes of the input units IP0 to IPn are coupled to the word lines WL0 to WLn, respectively. Each input unit IP includes an amplification circuit, and has a function of amplifying an input signal. Then, each input unit IP outputs an amplified signal to a corresponding word line WL. An amplification factor of a signal by the input unit IP may be changed depending on whether the coupled word line WL is the input layer IL or the reservoir layer RL.

The input unit IP may have a function of correcting an interval of a voltage to be output to the word line WL when the IV characteristic of the memory cell MC is not linear, that is, when a change in current (weight) flowing through the memory cell MC is not constant with respect to a change in voltage input to the memory cell MC. In other words, the input unit IP may have a function of adjusting the voltage to be output to the word line WL so that Ohm's law apparently holds true in the memory cell MC.

The output circuit 212 includes output units OP0 to OPm. Input nodes of the output units OP0 to OPm are coupled to the bit lines BL0 to BLm, respectively. Output nodes of the output units OP0 to OPm are coupled to nodes OUT0 to OUTm, respectively. Each output unit OP includes an IV conversion circuit and an amplification circuit, and has a function of amplifying an input signal after IV conversion. Then, each output unit OP outputs the amplified signal to a corresponding node OUT.

The signal of each of the nodes OUT0 to OUTm may be input to the delay circuit 213. Further, the delay circuit 213 may output signals to the nodes IN0 to INn, respectively. For example, the signals output by delay circuit 213 to the nodes IN0 to INn are based on the signals input to the nodes OUT0 to OUTm, respectively. This example corresponds to a case in which the number of word lines WL and the number of bit lines BL are the same. An association between a node IN and a node OUT may be determined based on the memory area used as the reservoir layer RL. In the memory cell array 201, the memory area used as the input layer IL and the memory area used as the reservoir layer RL may be separated. In this case, n>m, and the output of the delay circuit 213 is coupled to (m+1) of the (n+1) nodes IN. If the memory area used as the input layer IL and the memory area used as the reservoir layer RL are separated, the input unit IP corresponding to the input layer IL and the input unit IP corresponding to the reservoir layer RL may have different designs.

The signal of each of the nodes OUT0 to OUTm may be input to the determination circuit 214. An input circuit of the determination circuit 214 includes a plurality of input units respectively coupled to the nodes OUT0 to OUTm. Signals respectively input to these input units are input to an output circuit of the determination circuit 214 via the memory cell array of the determination circuit 214. A plurality of output units included in the output circuit of the determination circuit 214 each output a signal corresponding to a resistance value of a memory cell included in the memory cell array of the determination circuit 214 as a determination result. The memory controller 10 may perform an inference determination based on an accumulation of determination results received from the memory device 20.

(Structure of Memory Cell Array 201)

FIG. 9 is a plan view showing an example of a planar layout of the memory cell array 201 in the memory device 20 included in the memory system MS according to the first embodiment. In FIG. 9, an area associated with the word lines WL0 to WL3 and the bit lines BL0 to BL3 is extracted and shown. As shown in FIG. 9, the memory cell array 201 includes a plurality of conductive layers 30 and a plurality of conductive layers 31.

Each conductive layer 30 has a portion extending in the X direction. The conductive layers 30 are arranged side by side in the Y direction. The conductive layers 30 are separate from each other. The conductive layers 30 are used as the word lines WL0 to WL3, respectively. The number of conductive layers 30 in the memory cell array 201 corresponds to the number of word lines WL.

Each conductive layer 31 has a portion extending in the Y direction. The conductive layers 31 are arranged side by side in the X direction. The conductive layers 31 are separate from each other. The conductive layers 31 are used as the bit lines BL0 to BL3, respectively. The number of conductive layers 31 in the memory cell array 201 corresponds to the number of bit lines BL.

One memory cell MC is provided at each of the intersections of the conductive layers 30 and 31. In other words, the memory cell MC is provided at each of a plurality of intersections between the conductive layers 30 and the conductive layers 31. In the Z direction, each memory cell MC is sandwiched between one conductive layer 30 and one conductive layer 31. Then, each memory cell MC is coupled between one conductive layer 30 and one conductive layer 31.

FIG. 10 is a cross-sectional view taken along line X-X in FIG. 9, showing an example of a cross-sectional structure of the memory cell array 201 in the memory device 20 included in the memory system MS according to the first embodiment. As shown in FIG. 10, the memory cell MC includes, for example, a paraelectric film 32 and a ferroelectric film 33.

The paraelectric film 32 is provided on the conductive layer 31 (bit line BL). The ferroelectric film 33 is provided on the paraelectric film 32. The conductive layer 30 (word line WL) is provided on the ferroelectric film 33. The paraelectric film 32 is, for example, a silicon oxide film, a silicon nitride film, or a metal oxide. Metal oxides that can be utilized as the paraelectric film 32 include, for example, an oxide of at least one element of a group consisting of titanium (Ti), tungsten (W), tantalum (Ta), hafnium (Hf), aluminum (Al), and zinc (Zn). The ferroelectric film 33 is, for example, a hafnium oxide, a zirconium oxide, a compound of a hafnium oxide and a zirconium oxide, or a silicate film (HfSiOx). Thus, the memory cell MC functions as a two-terminal FTJ (Ferroelectric Tunnel Junction) element sandwiched between the lower electrode (conductive layer 31) and the upper electrode (conductive layer 30).

The FTJ element is a kind of resistance changing element. The FTJ element can realize a low-current and low-voltage driving and high-speed switching, and has rectifying characteristics. In the memory cell MC, the direction in which electrons flow from the conductive layer 31 to the conductive layer 30 corresponds to the forward direction, and the direction in which electrons flow from the conductive layer 30 to the conductive layer 31 corresponds to the reverse direction. The resistance value of the memory cell MC may change, depending on an amount of polarization of the ferroelectric film 33. The amount of polarization of the ferroelectric film 33 changes when a forward write voltage or a reverse write voltage is applied to the memory cell MC. The resistance value of the memory cell MC decreases when the forward write voltage (set pulse) is applied and increases when the reverse write voltage (reset pulse) is applied.

The memory cell MC included in the memory cell array 201 is not limited to the FTJ element. The memory cell MC may have other configurations as long as it is a resistance changing element. In this example, the conductive layer 30 (word line WL) is provided above the conductive layer 31 (bit line BL), but the conductive layer 30 and the conductive layer 31 may be interchanged.

The order in which the paraelectric film 32 and the ferroelectric film 33 are stacked in the memory cell MC may be changed in accordance with how the word line WL and the bit line BL are coupled.

[1-2] Operation

In the following, an operation of the memory system MS according to the first embodiment will be described with a case in which the FTJ element is used as the memory cell MC as an example. First, an overview of a write operation of the memory device 20 will be described as an operation related to a learning operation. Assignment of functions in the learning operation and a flow of the learning operation will then be described in turn.

[1-2-1] Outline of Write Operation

Figure 11:
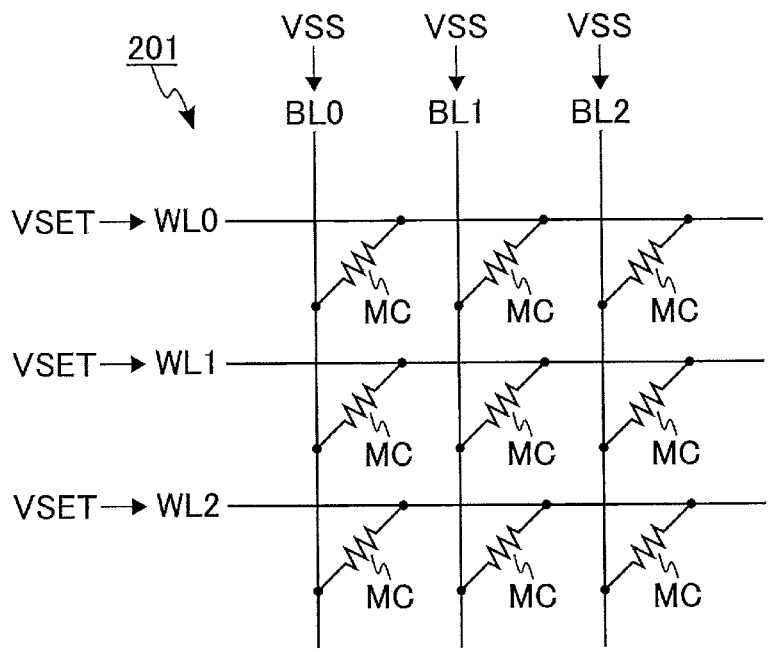
FIG. 11 is a schematic diagram showing an example of a write operation in the memory device included in the memory system according to the first embodiment.

FIG. 11 is a schematic diagram showing an example of a write operation in the memory device 20 included in the memory system MS according to the first embodiment. FIG. 11 shows selected word lines WL0 to WL2, selected bit lines BL0 to BL2, and memory cells MC coupled to these word lines WL and bit lines BL in the memory cell array 201, and an example of voltages respectively applied to the word lines WL and bit lines BL in a write operation for a plurality of memory cells MC.

As shown in FIG. 11, in the write operation, the control circuit 208 applies a set (write) voltage VSET to each of the selected word lines WL0 to WL2 and a ground voltage VSS to each of the selected bit lines BL0 to BL2. This applies a forward write voltage between the selected word line WL and the selected bit line BL, which lowers the resistance value of the memory cell MC coupled to the pair of the selected word line WL and the selected bit line BL. In this way, the write operation may be executed by selecting a plurality of word lines WL and a plurality of bit lines BL. The configuration is not limited thereto, and the write operation may be executed by selecting one word line WL and a plurality of bit lines BL, a plurality of word lines WL and one bit line BL, or one word line WL and one bit line BL.

Figure 12:
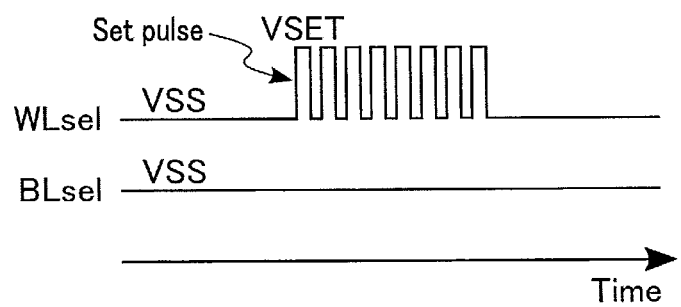
FIG. 12 is a timing chart showing an example of the write operation in the memory device included in the memory system according to the first embodiment.

FIG. 12 is a timing chart showing an example of a write operation in the memory device 20 included in the memory system MS according to the first embodiment. FIG. 12 shows a voltage applied to a selected word line WL ("WLsel" in FIG. 12) and a voltage applied to a selected bit line BL ("BLsel" in FIG. 12) in the write operation.

As shown in FIG. 12, in the write operation, the control circuit 208 applies the set voltage VSET to the selected word line WLsel multiple times while maintaining the voltage of the selected bit line BLsel at VSS. In other words, the control circuit 208 applies set pulses to the selected word line WLsel multiple times while maintaining the voltage of the selected bit line BLsel at VSS. The write operation to the memory cell MC using the FTJ element may adjust a range of reduction of the resistance value of the memory cell MC according to the number of times the set pulses are applied.

Figure 13:
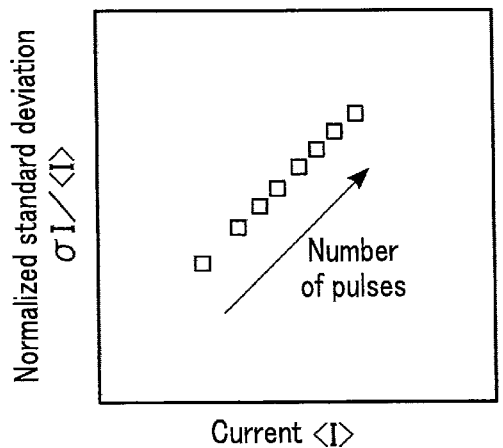
FIG. 13 is a graph showing an example of a change in standard deviation of a current due to the write operation in the memory device included in the memory system according to the first embodiment.

FIG. 13 is a graph showing an example of a change in standard deviation of a current due to a write operation in the memory device 20 included in the memory system MS according to the first embodiment. In this graph, an abscissa axis indicates an average value $<I>$ of a current flowing through each of the plurality of memory cells MC, and an ordinate axis indicates a standard deviation $\sigma I/<I>$, which is normalized by dividing the standard deviation $\sigma I$ of the current flowing through each of the memory cells MC by the average value $<I>$.

A plurality of plots in the graph shown in FIG. 13 correspond to the number of times (number of pulses) set pulses are applied to a plurality of memory cells MC in an erase state. The resistance value of the memory cell MC using the FTJ element tends to decrease as the number of times the set pulses are applied increases. Thus, the current flowing through the memory cell MC increases as the number of pulses increases. The write characteristics of the memory cell MC may vary depending on a variation in film thickness of each layer constituting the memory cell MC and a write variation in polarization orientation of the hafnium oxide.

As a result, the variation in current (weight) in a plurality of memory cells MC is correlated with a magnitude of the current (the resistance value of the memory cell MC). Specifically, the greater the resistance value of the memory cell MC, i.e., the fewer the number of pulses applied and the smaller the current flowing through the memory cell MC, the smaller the variation (normalized standard deviation value) in current among the plurality of memory cells MC. On the other hand, the smaller the resistance value of the memory cell MC, i.e., the greater the number of pulses applied and the larger the current flowing through the memory cell MC, the larger the variation (normalized standard deviation value) in current among the plurality of memory cells MC.

In the write operation, a verify read operation may be executed if writing of "0" data or "1" data is executed. The verify read operation is a read operation to determine whether or not a resistance value of a memory cell reaches a desired resistance value. In an erase operation, reset pulses are applied multiple times to a memory cell MC to be erased. For example, the erase operation of the memory device 20 is similar to when, in the write operation, a voltage applied to a selected bit line BL and a voltage applied to a selected word line WL are interchanged or when a voltage applied to a selected bit line BL is a positive voltage. A method of writing and erasing of a memory cell MC can be modified according to the type of resistance changing element used.

[1-2-2] Assignment of Functions of Memory Device 20 in Learning Operation

FIG. 14 is a schematic diagram showing an example of assignment of functions of the memory device 20 in the learning operation of the memory system MS according to the first embodiment. Each of U(t), X(t), and Z(t) surrounded by "ø" in FIG. 14 corresponds to a node assignment in the reservoir computing. In this example, it is assumed that the determination circuit 214 has circuits similar to the memory cell array 201, input circuit 211, and output circuit 212. Hereinafter, the bit lines BL, word lines WL, memory cells MC, input units IP, and output units OP provided in the determination circuit 214 will be referred to as "bit lines BLo", "word lines WLo", "memory cells MCo", "input units IPo", and "output units OPo", respectively.

As shown in FIG. 14, in the memory cell array 201, a memory cell MC coupled to one of the word lines WL0 and WL1 and one of the bit lines BL0 to BL2 is assigned as a memory cell MC of the input layer IL (hereinafter referred to as a memory cell MCi). In the memory cell array 201, a memory cell MC coupled to one of the word lines WL2 to WL4 and one of the bit lines BL0 to BL2 is assigned as a memory cell MC of the reservoir layer RL (hereinafter referred to as a memory cell MCr). That is, the memory cell MCi and the memory cell MCr share the bit line BL. In the determination circuit 214, a memory cell MCo coupled to one of word lines WLo0 to WLo2 and one of bit lines BLo0 and BLo1 is assigned as a memory cell MCo of the output layer OL.

The input unit IP0 amplifies a signal corresponding to the node U(1) input from the input signal processing circuit 210, and outputs the amplified signal to the word line WL0. The input unit IP1 amplifies a signal corresponding to the node U(2) input from the input signal processing circuit 210, and outputs the amplified signal to the word line WL1. The output unit OP0 IV converts and amplifies a signal input via the bit line BL0, and outputs the amplified signal to the node OUT0. The output unit OP1 IV converts and amplifies a signal input via the bit line BL1, and outputs the amplified signal to the node OUT1. The output unit OP2 IV converts and amplifies a signal input via the bit line BL2, and outputs the amplified signal to the node OUT2. The signals output to the nodes OUT0, OUT1, and OUT2 correspond to the nodes X(1), X(2), and X(3), respectively. The signals of the nodes X(1), X(2), and X(3) are input to the delay circuit 213.

The delay circuit 213 delays the signals of the nodes X(1), X(2), and X(3) output to the nodes OUT0, OUT1, and OUT2, respectively, and outputs the delayed signals to the input circuit 211 via the nodes IN2, IN3, and IN4, respectively. The input unit IP2 amplifies or attenuates the signal corresponding to the node X(1) input from the delay circuit 213, and outputs the amplified or attenuated signal to the word line WL2. The input unit IP3 amplifies or attenuates the signal corresponding to the node X(2) input from the delay circuit 213, and outputs the amplified or attenuated signal to the word line WL3. The input unit IP4 amplifies or attenuates the signal corresponding to the node X(3) input from the delay circuit 213, and outputs the amplified or attenuated signal to the word line WL4.

As a result, at each bit line BL, the signals of the nodes U(t) through the memory cells MCi and the signals of the nodes X(t) through the memory cells MCr are integrated. The integrated signal is then input to the output unit OP. In other words, a signal obtained by integrating the signals of the nodes U(t), which reflect the weights of the memory cells MCi in the input layer IL, and the signals of the nodes X(t), which reflect the weights of the memory cells MCr in the reservoir layer RL, is input to the output unit OP.

More specifically, a signal obtained by integrating a signal based on the node U(1) transmitted through the memory cell MCi coupled to the word line WL0 and the bit line BL0, a signal based on the node U(2) transmitted through the memory cell MCi coupled to the word line WL1 and the bit line BL0, a signal based on the node X(1) transmitted through the memory cell MCr coupled to the word line WL2 and the bit line BL0, a signal based on the node X(2) transmitted through the memory cell MCr coupled to the word line WL3 and the bit line BL0, and a signal based on the node X(3) transmitted through the memory cell MCr coupled to the word line WL4 and the bit line BL0 is input to the output unit OP0. Similarly, an integrated signal is input to each output unit OP via a corresponding bit line BL. An amplification or attenuation factor of the input unit IP corresponding to the reservoir layer RL is designed according to data of how many past samples of time-series data to be learned is to be included in the signals to be processed by the output layer OL.

Further, the signals of the nodes X(1), X(2), and X(3) are also input to the input units IPo0, IPo1, and IPo2 of the determination circuit 214, respectively. The input unit IPo0 amplifies the signal corresponding to the node X(1), and outputs the amplified signal to the word line WLo0. The input unit IPo1 amplifies the signal corresponding to the node X(2), and outputs the amplified signal to the word line WLo1. The input unit IPo2 amplifies the signal corresponding to the node X(3), and outputs the amplified signal to the word line WLo2. The output unit OPo0 IV converts and amplifies the signal input via the bit line BLo0, and outputs the amplified signal as the node Z(1). The output unit OPo1 IV converts and amplifies the signal input via the bit line BLo1, and outputs the amplified signal as the node Z(2).

For example, each of the signals output as the nodes Z(1) and Z(2) is transferred to the memory controller 10 as a determination result for each sample. The memory controller 10 transmits an instruction to change the resistance value of each memory cell MCo in the output layer OL to the memory device 20 based on a matrix of the determination results received from the memory device 20. Thus, the memory system MS can adjust (i.e., learn) the resistance value of each memory cell MCo in the output layer OL according to data (supervised data) to be learned. In the reservoir computing, each memory cell MCi in the input layer IL and each memory cell MCr in the reservoir layer RL are not subject to learning, and only the memory cells MCo in the output layer OL are subject to learning. Further, the variation in resistance value of the plurality of memory cells MCr in the reservoir layer RL is used as a variation in weight of the reservoir layer in the reservoir computing.

The node X(t) of the reservoir layer RL corresponds to the memory cell MC allocated to the reservoir layer RL. In the memory system MS, the reservoir size corresponds to the number of bit lines BL allocated to the reservoir layer RL or the number of word lines WL allocated to the reservoir layer RL. That is, for example, when the reservoir size is "M", the number of memory cells MC in the reservoir layer RL is "a square of M".

[1-2-3] Flow of Learning Operation

Figure 15:
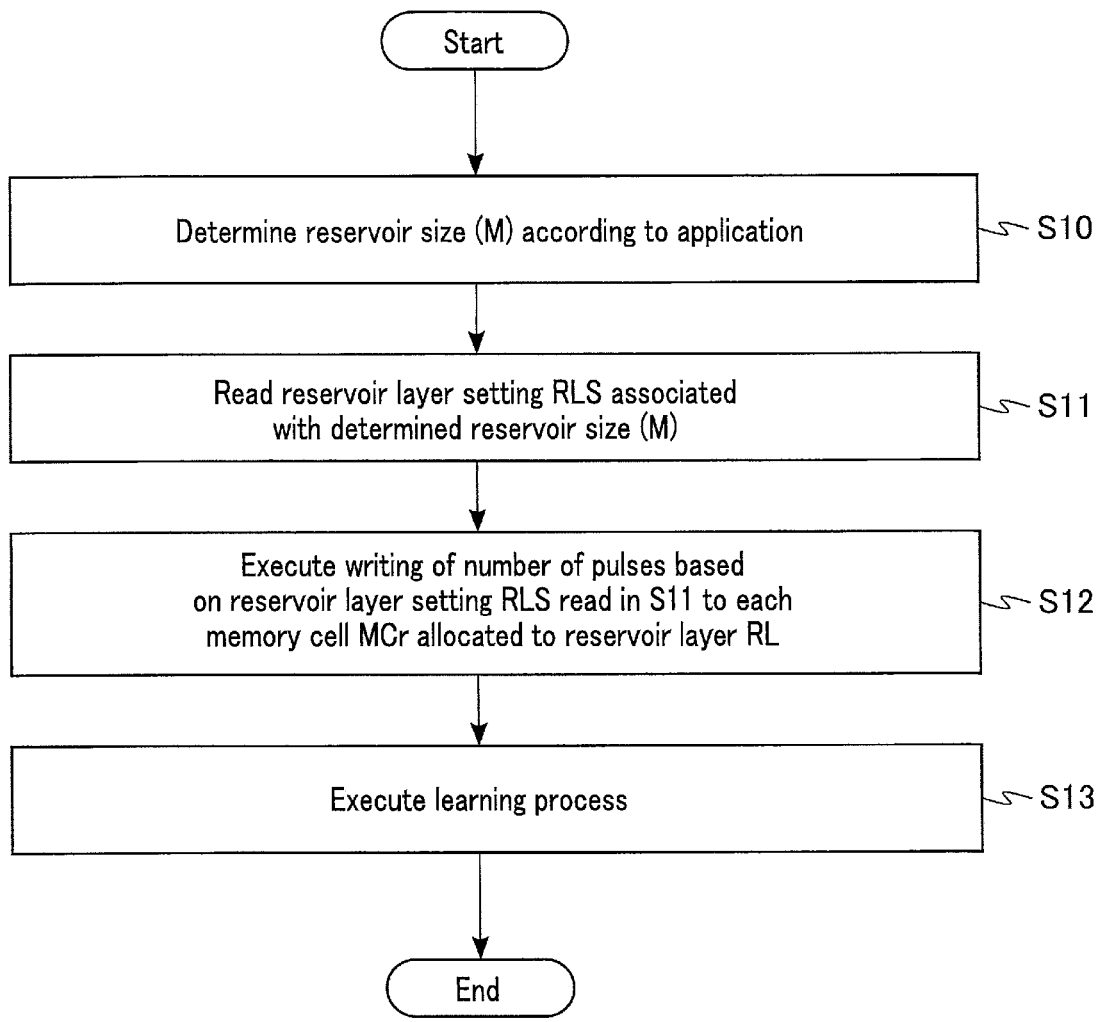
FIG. 15 is a flowchart showing an example of a flow of the learning operation of the memory system according to the first embodiment.

FIG. 15 is a flowchart showing an example of a flow of a learning operation of the memory system MS according to the first embodiment. The flow of the learning operation of the memory system MS will be described below with reference to FIG. 15. In the following description, it is assumed that each memory cell MCr allocated to the reservoir layer RL is in an erase state.

When at least one piece of supervised data and an instruction to execute a learning operation are received from the host device HD, the memory controller 10 starts the learning operation (Start).

First, the memory controller 10 determines a reservoir size (M) according to an application (S10). For example, the memory controller 10 refers to the setting information 110 to determine the reservoir size. Specifically, the memory controller 10 can determine the reservoir size based on the type of application associated with the supervised data received from the host device HD. A value instructed by the host device HD may be used as the reservoir size.

Next, the memory controller 10 reads a reservoir layer setting RLS associated with the determined reservoir size (M) (S11). The reservoir layer setting RLS contains information on adjusting a weight variation (variation in current flowing through each memory cell MCr) of the reservoir layer RL. Specifically, the reservoir layer setting RLS of the first embodiment contains information on the number of set pulses (number of pulses) to be applied to the memory cell MCr allocated to the reservoir layer RL.

Next, the memory controller 10 causes the memory device 20 to write the number of pulses based on the reservoir layer setting RLS read in the process of S11 with respect to each memory cell MCr allocated to the reservoir layer RL (S12). Specifically, for example, seven set pulses corresponding to an optimal $\sigma=0.1$ of the reservoir size are applied to each memory cell MCr of the reservoir layer RL. Thereby, the resistance value of each memory cell MCr of the reservoir layer RL is changed to a resistance value that can realize $\sigma=0.1$. The verify read operation may be omitted in the process of S12. Other methods of writing may be used in the process of S12, as long as the resistance value of the memory cell MCr can be set to a state corresponding to the optimal $\sigma$. For example, a reset pulse may be used in the process of S12. If the number of set pulses applied from the erase state is recorded, the number of set pulses obtained by subtracting the number of pulses already applied from the target number of pulses may be applied to each memory cell MCr.

Next, the memory controller 10 performs learning processing (S13). In the learning processing, the memory controller 10 calculates an optimal resistance value of each memory cell MCo of the output layer OL according to the resistance value of each memory cell MCr of the reservoir layer RL. The memory controller 10 then executes a write operation to each memory cell MCo so that the resistance value of each memory cell MCo becomes the calculated optimal resistance value. For example, a ridge regression method, etc. is used to calculate the optimal resistance value of the memory cell MCo. The calculation of the optimal resistance value of the memory cell MCo is assumed to be performed outside the memory system MS, for example, on an external server via the host device HD.

When it is detected that the accuracy of a model exceeds a predetermined threshold value, the memory controller 10 completes the process of S13. The memory controller 10 then ends a series of processes shown in FIG. 15 (End). After that, the memory controller 10 can use the areas allocated as the input layer IL, reservoir layer RL, and output layer OL in that learning operation as trained models.

[1-3] Advantageous Effects of First Embodiment

The memory system MS using a two-terminal memory such as an FTJ element can easily be densified and perform a product-sum operation. Further, use of the memory system MS using a two-terminal memory for reservoir computing has an advantage that the respective memory areas of the input layer IL, reservoir layer RL, and output layer OL can be formed in a batch.

The memory system MS can also change the size (reservoir size) of the memory area allocated as the reservoir layer RL according to the application. For example, the memory system MS sets a small reservoir size if reducing power consumption is a higher priority than learning accuracy. On the other hand, the memory system MS sets a large reservoir size if learning accuracy is a higher priority than reducing power consumption. Thus, the memory system MS can achieve a balance between learning performance and power consumption according to user requirements by having the function of changing the reservoir size according to the application.

However, the reservoir computing has the characteristic that the optimal variation in weight differs according to the reservoir size. Thus, when the reservoir size is changed according to the application, it is preferable that the weight variation of each memory cell MCr in the reservoir layer RL be adjusted. In other words, the memory system MS write or erase for each memory cell MCr each time the reservoir size is changed. The optimal variation in weight in the reservoir layer RL is dependent on the reservoir size. The variation in weight in the plurality of memory cells MCr tends to vary according to the number of times set pulses are applied.

Accordingly, the memory system MS according to the first embodiment applies set pulses a number of times corresponding to the reservoir size to each memory cell MCr in the reservoir layer RL before the learning processing, based on the fact that the variation in resistance value of the memory cells MCr is correlated with the number of times set pulses are applied. In other words, the memory system MS manages (adjusts) the variation in resistance value (weight) in the plurality of memory cells MCr allocated as the reservoir layer RL by the number of times set pulses are applied in order to achieve the optimal variation in weight of the reservoir layer RL. The number of times set pulses are applied to each memory cell MCr in the reservoir layer RL is determined based on an association between the reservoir size and the optimal $\sigma$ such as, for example, the setting information 110.

As a result, the memory system MS according to the first embodiment can collectively optimize the weight variation of the reservoir layer RL according to the reservoir size set for each application. That is, the memory system MS can omit adjusting the resistance value for each memory cell MCr in the reservoir layer RL in preparation for the learning processing. As a result, the memory system MS according to the first embodiment can adjust the weight variation of the reservoir layer according to the reservoir size and improve the learning performance for each reservoir size. The memory system MS can also reduce the time required to prepare for the learning processing.

In the first embodiment, the case of adjusting the weight variation of each memory cell MCr in the reservoir layer RL according to the number of set pulses is exemplified, but the configuration is not limited thereto. The memory system MS may adjust the weight variation of each memory cell MCr of the reservoir layer RL according to the time for which the set voltage SET is applied to the memory cell MC. In this case, for example, the setting information 110 contains information that associates the reservoir size with the application time of the set voltage VSET. For example, a sum of pulse widths of the set pulses shown in FIG. 12 corresponds to the application time of the set voltage VSET. The memory system MS then executes writing to each memory cell MCr of the reservoir layer RL based on the reservoir size and the application time of the set voltage VSET based on the setting information 110. In such a case, the memory system MS can adjust the weight variation of the reservoir layer according to the reservoir size, thereby improving the learning performance for each reservoir size.

[2] Second Embodiment

A memory system MSa according to a second embodiment adjusts the weight variation of the reservoir layer RL by changing control parameters of the output circuit 212 (analog circuit). Details of the memory system MSa according to the second embodiment will be described below.

[2-1] Configuration

FIG. 16 is a schematic diagram showing an example of a circuit configuration of a memory cell array 201 and a configuration of some of the peripheral circuits, in a memory device 20a included in the memory system MSa according to the second embodiment. As shown in FIG. 16, the memory device 20a has a configuration in which the output circuit 212 is replaced with an output circuit 212a with respect to the memory device 20 of the first embodiment.

The output circuit 212a includes output units OPa0 to OPam. Input nodes of the output units OPa0 to OPam are coupled to the bit lines BL0 to BLm, respectively. Output nodes of the output units OPa0 to OPam are coupled to the nodes OUT0 to OUTm, respectively. Similarly to the output unit OP, each output unit OPa has the function of amplifying an input signal after IV conversion and outputting the amplified signal to a corresponding node OUT. Furthermore, each output unit OPa is provided with an IV conversion circuit that can adjust the weight variation of the reservoir layer RL.

FIG. 17 is a circuit diagram showing an example of a circuit configuration of the output unit OPa in the memory device 20a included in the memory system MSa according to the second embodiment. As shown in FIG. 17, the output unit OPa includes operational amplifiers OA1 and OA2, resistors R1, R2, R3 and R4, a variable resistor RX, and nodes N1 to N5. A pair of the operational amplifier OA1 and the variable resistor RX functions as an IV conversion circuit capable of adjusting the weight variation in the reservoir layer RL. A set of the operational amplifier OA2 and the resistors R1 to R4 functions as a differential amplifier circuit.

An inverting input of the operational amplifier OA1 is coupled to the node N1. The node N1 is coupled to a corresponding bit line BL. A non-inverting input of the operational amplifier OA1 is coupled to a ground node. An output of the operational amplifier OA1 is coupled to the node N2. The variable resistor RX is electrically coupled between the nodes N1 and N2.

An inverting input of the operational amplifier OA2 is coupled to the node N3. A non-inverting input of the operational amplifier OA2 is coupled to the node N4. An output of the operational amplifier OA2 is coupled to the node N5. The node N5 is coupled to a corresponding node OUT. The resistor R1 is electrically coupled between the nodes N2 and N3. The resistor R2 is electrically coupled between the nodes N3 and N5. One end of the resistor R3 is coupled to the node N4. A reference voltage VREF is applied to the other end of the resistor R3. That is, a voltage based on the reference voltage VREF is applied to the non-inverting input of the operational amplifier OA2 via the resistor R3. The resistor R4 is electrically coupled between the node N4 and the ground node. The resistance value of the resistor R1 is designed to be approximately equal to the resistance value of the resistor R3 (R1=R3). The resistance value of the resistor R2 is designed to be approximately equal to the resistance value of the resistor R4 (R2=R4).

An optimal value of the resistance value of the variable resistor RX, i.e., the resistance value of the variable resistor RX that can achieve the optimal weight variation in the reservoir layer RL, is calculated based on the following formula (1).

[Formula 1]

$$RX = \frac{\sqrt{M}}{k \times \sigma\left(\frac{IBL}{VIN}\right)} \quad (1)$$

An optimal value of the reference voltage VREF, i.e., a value of the reference voltage VREF that can achieve the optimal weight variation in the reservoir layer RL, is calculated based on the following formula (2).

[Formula 2]

$$VREF = RX \times <IBL> \quad (2)$$

A value of the voltage VRES output by the output unit OPa based on an input current IBL is calculated based on the following formula (3).

[Formula 3]

$$VRES = (RX \times IBL - VREF) \times k \quad (3)$$

In this specification, reference signs included in the formulae indicate the numerical values corresponding to those reference signs. For example, R1 to R4 in the formulae indicate the resistance values of the resistors R1 to R4, respectively. "k" is a value obtained by dividing the resistance value of the resistor R2 by the resistance value of the resistor R1 (k=R2/R1). "M" corresponds to the reservoir size. "<IBL>" corresponds to an average value of the current IBL. "VIN" corresponds to a voltage to be applied to the variable resistor RX. A range of values that can be set for each of RX and VREF is determined according to the design of the memory device 20. In the memory system MSa, the optimal value of each of RX and VREF is determined based on this range. The determined optimal values of RX and VREF are recorded, for example, in the reservoir layer setting RLS of the setting information 110. The other configurations of the memory system MSa according to the second embodiment are the same as those of the memory system MS according to the first embodiment.

[2-2] Learning Operation

Figure 18:
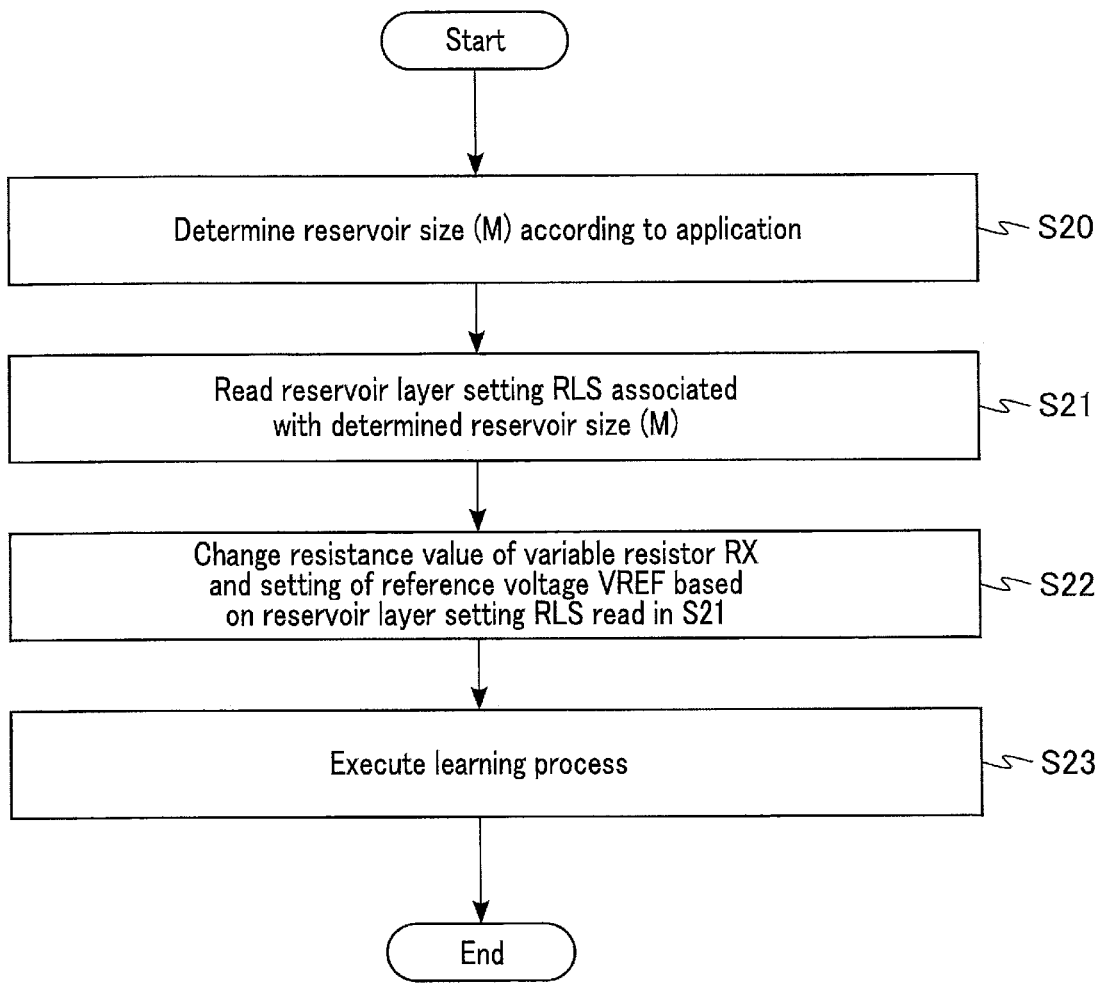
FIG. 18 is a flowchart showing an example of a flow of a learning operation of the memory system according to the second embodiment.

FIG. 18 is a flowchart showing an example of a flow of a learning operation of the memory system MSa according to the second embodiment. The flow of the learning operation of the memory system MSa will be described below with reference to FIG. 18.

Similarly to the first embodiment, the memory controller 10 starts the learning operation when at least one piece of supervised data and an instruction to execute the learning operation are received from the host device HD (Start).

First, the memory controller 10 determines a reservoir size (M) according to an application in the same manner as in the first embodiment (S20).

Next, the memory controller 10 reads the reservoir layer setting RLS associated with the determined reservoir size (M) in the same manner as in the first embodiment (S21). The reservoir layer setting RLS of the second embodiment includes information on adjustment values (the resistance value of the variable resistor RX and the voltage value of the reference voltage VREF) of the output circuit 212a in order to achieve an optimal variation in weight of the reservoir layer RL.

Next, the memory controller 10 causes the memory device 20a to change the resistance value of the variable resistor RX and the setting of the reference voltage VREF based on the reservoir layer setting RLS read in S21 (S22).

Next, the memory controller 10 performs learning processing in the same manner as in the first embodiment (S23).

If it is detected that the accuracy of a model exceeds a predetermined threshold value, the memory controller 10 completes the process of S23. The memory controller 10 then ends a series of processes shown in FIG. 18 (End). After that, the memory controller 10 can use the areas allocated as the input layer IL, reservoir layer RL, and output layer OL in that learning operation as trained models.

[2-3] Advantageous Effects of Second Embodiment

As described above, the memory device 20a included in the memory system MSa according to the second embodiment includes an output circuit 212a capable of adjusting the weight of the reservoir layer RL. Then, the memory system MS according to the second embodiment changes the settings (the reference voltage VREF and the variable resistor RX) of the output circuit 212a based on the reservoir size, and adjusts a substantive weight variation of the reservoir layer RL.

Thereby, the memory system MSa according to the second embodiment can adjust the weight variation of the reservoir layer according to the reservoir size and improve the learning performance for each reservoir size in the same manner as in the first embodiment.

Further, the memory system MSa according to the second embodiment optimizes the weight variation of each memory cell MCr of the reservoir layer RL by means of the peripheral circuits. Thus, the memory system MSa according to the second embodiment can adjust the substantive weight variation of the reservoir layer RL without executing writing and erasing with respect to each memory cell MCr of the reservoir layer RL. Therefore, the memory system MS according to the second embodiment can more greatly reduce the time required to prepare for the learning processing than the first embodiment.

If the weight adjustment for each memory cell MCr of the reservoir layer RL is not executed, a predetermined number of set pulses may be applied to each memory cell MCr, or each memory cell MCr in an erase state or an initial state may be utilized. A memory cell MCr in an initial state corresponds to a state of a memory cell MCr at the time of shipment of the memory system MS.

[3] Third Embodiment

A memory system MSb according to a third embodiment has a configuration in which a memory cell MC used as a variable resistor RX is arranged in the memory cell array 201, and adjusts a weight variation of the reservoir layer RL using that memory cell MC and the output circuit 212. Details of the memory system MSb according to the third embodiment will be described below.

[3-1] Configuration

FIG. 19 is a schematic diagram showing an example of a circuit configuration of a memory cell array 201a and configurations of the input circuit 211 and an output circuit 212b in a memory device 20b included in the memory system MSb according to the third embodiment. As shown in FIG. 19, the memory device 20b has a configuration in which the memory cell array 201 is replaced with the memory cell array 201a and the output circuit 212 is replaced with the output circuit 212b with respect to the memory device 20 described in the first embodiment.

The memory cell array 201a has a configuration in which at least one word line WLX and a plurality of memory cells MCX are added to the memory cell array 201 described in the first embodiment. A structure of the word line WLX is the same as that of the other word lines WL. A structure of the memory cell MCX is the same as that of the other memory cells MC. That is, a resistance value of the memory cell MCX is created in the same order as that of the resistance values of the other memory cells MC. The word line WLX is coupled to one end of each of the plurality of memory cells MCX. The other ends of the memory cells MCX are coupled to the bit lines BL0 to BLm, respectively.

The output circuit 212b includes output units OPb0 to OPbm. Input nodes of the output units OPb0 to OPbm are coupled to the bit lines BL0 to BLm, respectively. Output nodes of the output units OPb0 to OPbm are coupled to the nodes OUT0 to OUTm, respectively. Similarly to the output unit OP described in the first embodiment, each output unit OPb has the function of amplifying an input signal after IV conversion and outputting the amplified signal to a corresponding node OUT. Furthermore, each output unit OPb has a node N2 coupled to the word line WLX, and includes an IV conversion circuit capable of adjusting the weight variation of the reservoir layer RL. In the third embodiment, the respective nodes N2 of the output units OPb are coupled to each other.

FIG. 20 is a circuit diagram showing an example of a circuit configuration of the output unit OPb in the memory device 20b included in the memory system MSb according to the third embodiment. As shown in FIG. 20, the output unit OPb has a configuration in which the variable resistor RX is omitted from the output unit OPa described in the second embodiment. Coupling relationships among the operational amplifiers OA1 and OA2, resistors R1, R2, R3, and R4, and nodes N1 to N5 in the output unit OPb are the same as those in the output unit OPa.

Then, in the output unit OPb, the memory cell MCX of the memory cell array 201a is coupled between the node N1 (corresponding bit line BL) and the node N2. Thereby, a pair of the operational amplifier OA1 and the memory cell MCX functions as an IV conversion circuit capable of adjusting the weight variation in the reservoir layer RL. That is, the memory cell MCX is used as a variable resistor (the variable resistor RX of the second embodiment) for adjusting the weight variation of the reservoir layer RL. In other words, in the third embodiment, the memory cell MCX used as the variable resistor RX is formed within the memory cell array 201. Between the nodes N1 and N2 in each output unit OPb, a plurality of memory cells MCX may be coupled in parallel via a plurality of word lines WLX. The other configurations of the memory system MSb according to the third embodiment are similar to those of the memory system MSa according to the second embodiment.

[3-2] Learning Operation

FIG. 21 is a flowchart showing an example of a flow of a learning operation of the memory system MSb according to the third embodiment. The flow of the learning operation of the memory system MSb will be described below with reference to FIG. 21.

Similarly to the first embodiment, the memory controller 10 starts the learning operation when at least one piece of supervised data and an instruction to execute the learning operation are received from the host device HD (Start).

First, the memory controller 10 determines a reservoir size (M) according to an application in the same manner as in the first embodiment (S30).

Next, the memory controller 10 reads the reservoir layer setting RLS associated with the determined reservoir size (M) in the same manner as in the first embodiment (S31). The reservoir layer setting RLS of the third embodiment includes information on the resistance value of each memory cell MCX and information on an adjustment value (the voltage value of the reference voltage VREF) of the output circuit 212b in order to achieve an optimal variation in weight of the reservoir layer RL.

Next, the memory controller 10 causes the memory device 20b to change the setting of the reference voltage VREF based on the reservoir layer setting RLS read in S31 (S32). For the reference voltage VREF, a common voltage is used in each output unit OPb of the output circuit 212b.

Next, the memory controller 10 causes the memory device 20b to execute a write and/or erase operation based on the reservoir layer setting RLS read in S31 with respect to each memory cell MCX (S33). Thereby, the resistance value of each memory cell MCX is adjusted to an optimal resistance value indicated by the reservoir layer setting RLS.

Next, the memory controller 10 performs learning processing in the same manner as in the first embodiment (S34).

If it is detected that the accuracy of a model exceeds a predetermined threshold value, the memory controller 10 completes the process of S34. The memory controller 10 then ends a series of processes shown in FIG. 21 (End). After that, the memory controller 10 can use the areas allocated as the input layer IL, reservoir layer RL, and output layer OL in that learning operation as trained models.

In the learning operation of the memory system MSb according to the third embodiment, the process of S33 may be omitted if adjustment of the reservoir layer RL to an optimal variation can be achieved only by changing the reference voltage VREF.

[3-3] Advantageous Effects of Third Embodiment

As described above, the memory device 20b included in the memory system MSb according to the third embodiment includes an output circuit 212b capable of adjusting the weights of the reservoir layer RL. Then, the memory system MSb according to the third embodiment adjusts a substantive weight variation of the reservoir layer RL using the output circuit 212b and the memory cell MCX provided in the memory cell array 201a in the same manner as in the second embodiment.

Thereby, the memory system MSb according to the third embodiment can adjust the weight variation of the reservoir layer according to the reservoir size and improve the learning performance for each reservoir size, in the same manner as in the second embodiment.

Further, in the memory system MSb according to the third embodiment, since the output unit OPb uses the memory cell MCX of the memory cell array 201a as the variable resistor RX, it is possible to adjust resistance values related to adjustment of the weight variation more easily than in the second embodiment. Since the memory cell MCX is used as the variable resistor RX in the memory system MS according to the third embodiment, a resistance value can be adjusted in a range similar to that of the memory cell MC.

[4] Fourth Embodiment

A memory system MSc according to a fourth embodiment has a configuration in which a plurality of memory cells MC for adjusting a weight variation are coupled to each bit line BL of the memory cell array 201. Then, the memory system MSc adjusts the weight variation of the reservoir layer RL by switching coupling between that plurality of memory cells MC and the output circuit 212 as appropriate. Details of the memory system MSc according to the fourth embodiment will be described below.

[4-1] Configuration

FIG. 22 is a schematic diagram showing an example of a circuit configuration of the memory cell array 201b and configurations of the input circuit 211 and an output circuit 212c in the memory device 20c included in the memory system MSc according to the fourth embodiment. As shown in FIG. 22, the memory device 20c has a configuration in which the memory cell array 201 is replaced with a memory cell array 201b, the output circuit 212 is replaced with the output circuit 212c, and a switch circuit 220 is added with respect to the memory device 20 described in the first embodiment.

The memory cell array 201b has a configuration in which two or more word lines WLX and a plurality of memory cells MCX are added to the memory cell array 201 described in the first embodiment. A structure of each of the word lines WLX is the same as that of the other word lines WL. A structure of each of the memory cells MCX is the same as that of the other memory cells MC. In this example, the memory cell array 201b includes two word lines WLX (WLX0 and WLX1). Further, the memory cell array 201b includes a plurality of memory cells MCX0 coupled to the word line WLX0 and a plurality of memory cells MCX1 coupled to the word line WLX1. The word line WLX0 is coupled to one end of each of the plurality of memory cells MCX0. The other ends of the memory cells MCX0 are coupled to the bit lines BL0 to BLm, respectively. The word line WLX1 is coupled to one end of each of the plurality of memory cells MCX1. The other ends of the memory cells MCX1 are coupled to the bit lines BL0 to BLm, respectively.

The output circuit 212c includes output units OPc0 to OPcm. Input nodes of the output units OPc0 to OPcm are coupled to the bit lines BL0 to BLm, respectively. Output nodes of the output units OPc0 to OPcm are coupled to the nodes OUT0 to OUTm, respectively. Similarly to the output unit OP described in the first embodiment, each output unit OPc has the function of amplifying an input signal after IV conversion and outputting the amplified signal to a corresponding node OUT. Furthermore, each output unit OPc has the node N2 coupled to each switch SW included in the switch circuit 220, and includes an IV conversion circuit capable of adjusting a weight variation of the reservoir layer RL. In the fourth embodiment, the respective nodes N2 of the output units OPc are coupled to each other.

The switch circuit 220 includes a plurality of switches SW corresponding to the number of word lines WLX. In this example, the switch circuit 220 includes switches SW0 and SW1. The switch SW0 is coupled between the word line WLX0 and the node N2 of the output circuit 212c. The switch SW1 is coupled between the word line WLX1 and the node N2 of the output circuit 212c. Each switch SW electrically couples or decouples the associated word line WLX and node N2 based on control of the control circuit 208.

Figure 23:
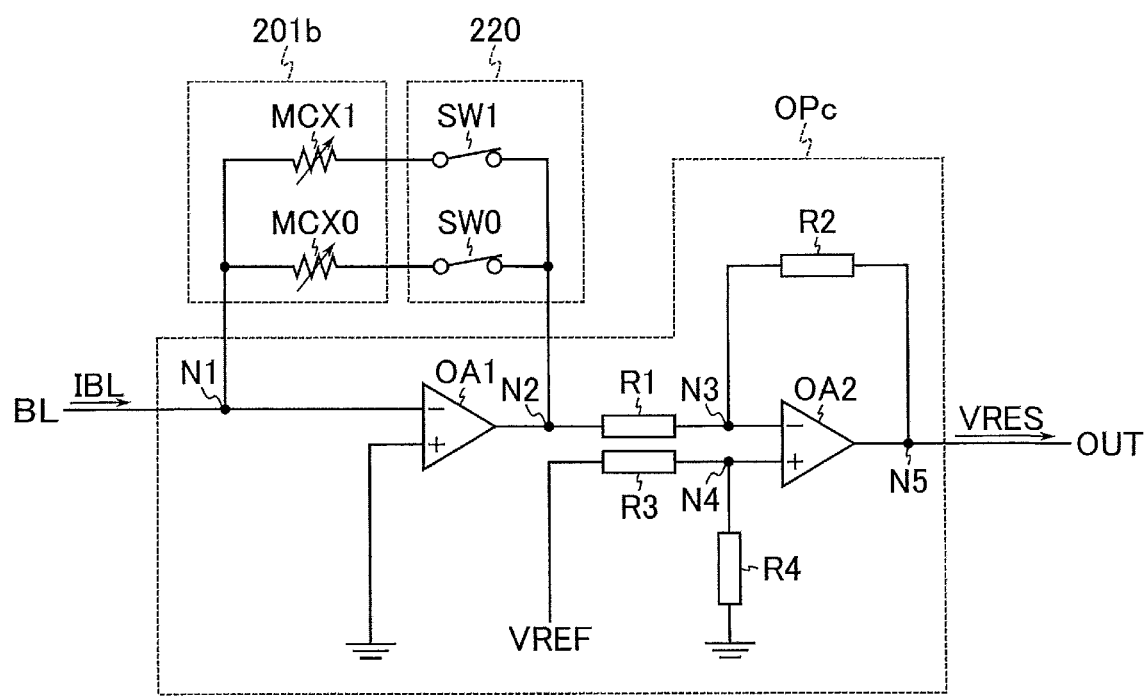
FIG. 23 is a circuit diagram showing an example of a circuit configuration of a signal output unit in the memory device included in the memory system according to the fourth embodiment.

FIG. 23 is a circuit diagram showing an example of a circuit configuration of the output unit OPc in the memory device 20c included in the memory system MSc according to the fourth embodiment. As shown in FIG. 23, the output unit OPc has a configuration in which the variable resistor RX is omitted from the output unit OPa described in the second embodiment. Coupling relationships among the operational amplifiers OA1 and OA2, resistors R1, R2, R3, and R4, and nodes N1 to N5 in the output unit OPc are the same as those in the output unit OPa.

Then, in the output unit OPc, between the node N1 (corresponding bit line BL) and the node N2, a plurality of pairs of a memory cell MCX of the memory cell array 201b and a switch SW of the switch circuit 220 are coupled in parallel. Specifically, in the output unit OPc, between the nodes N1 and N2, a pair of the memory cell MCX0 and the switch SW0 coupled in series and a pair of the memory cell MCX1 and the switch SW1 coupled in series are coupled in parallel. Thereby, a pair of the operational amplifier OA1 and at least one of the memory cells MCX0 and MCX1 functions as an IV conversion circuit capable of adjusting the weight variation in the reservoir layer RL. The other hardware configurations of the memory system MSc according to the fourth embodiment are similar to those of the memory system MSb according to the third embodiment.

[4-2] Learning Operation

Figure 24:
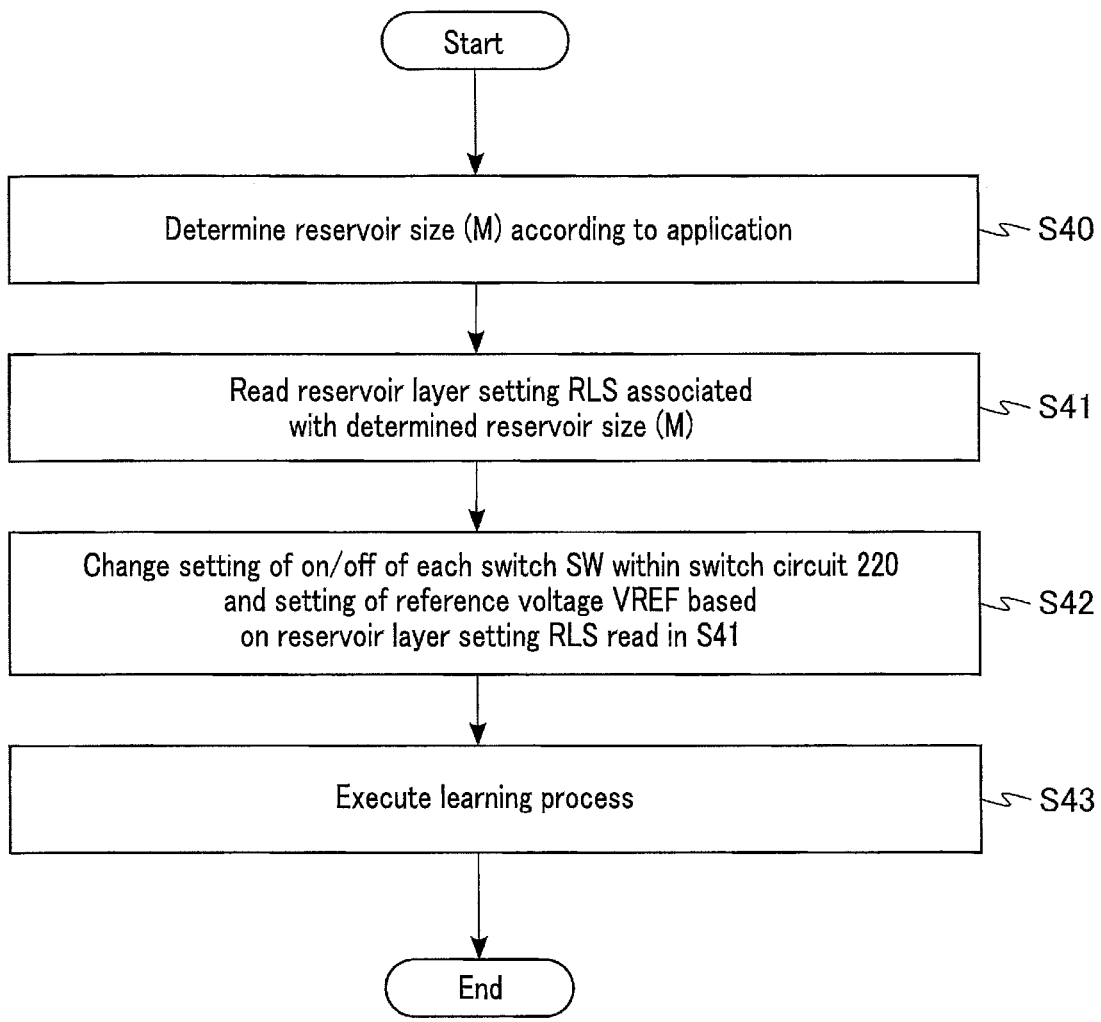
FIG. 24 is a flowchart showing an example of a flow of a learning operation of the memory system according to the fourth embodiment.

FIG. 24 is a flowchart showing an example of a flow of a learning operation of the memory system MSc according to the fourth embodiment. The flow of the learning operation of the memory system MSc will be described below with reference to FIG. 24.

Similarly to the first embodiment, the memory controller 10 starts the learning operation when at least one piece of supervised data and an instruction to execute the learning operation are received from the host device HD (Start).

First, the memory controller 10 determines a reservoir size (M) according to an application in the same manner as in the first embodiment (S40).

Next, the memory controller 10 reads the reservoir layer setting RLS associated with the determined reservoir size (M) in the same manner as in the first embodiment (S41). The reservoir layer setting RLS of the fourth embodiment includes control information of the switch circuit 220 and information on an adjustment value (the voltage value of the reference voltage VREF) of the output circuit 212c in order to achieve an optimal variation in weight of the reservoir layer RL.

Next, the memory controller 10 causes the memory device 20c to change the setting of an on/off of each switch SW within the switch circuit 220 and the setting of the reference voltage VREF based on the reservoir layer setting RLS read in S41 (S42). Thereby, a resistance value between the nodes N1 and N2 within each output unit OPc is adjusted to an optimal resistance value indicated by the reservoir layer setting RLS.

Next, the memory controller 10 performs learning processing in the same manner as in the first embodiment (S43).

If it is detected that the accuracy of a model exceeds a predetermined threshold value, the memory controller 10 completes the process of S43. The memory controller 10 then ends a series of processes shown in FIG. 24 (End). After that, the memory controller 10 can use the areas allocated as the input layer IL, reservoir layer RL, and output layer OL in that learning operation as trained models.

[4-3] Advantageous Effects of Fourth Embodiment

As described above, the memory device 20c included in the memory system MSc according to the fourth embodiment includes an output circuit 212c capable of adjusting the weights of the reservoir layer RL. Then, the memory system MSc according to the fourth embodiment adjusts a substantive weight variation of the reservoir layer RL by switching the couplings between the output circuit 212c and the groups of a plurality of memory cells MCX provided in the memory cell array 201b by the switch circuit 220 in the same manner as in the second embodiment.

Thereby, the memory system MSc according to the fourth embodiment can adjust the weight variation of the reservoir layer according to the reservoir size and improve the learning performance for each reservoir size in the same manner as in the first embodiment.

Further, the memory system MSc according to the fourth embodiment may be designed such that an optimal weight variation according to an application can be reproduced by an on/off of each switch SW within the switch circuit 220. That is, in the memory system MSc according to the fourth embodiment, a plurality of pairs of a switch SW and a memory cell MCX may be formed in the memory cell array 201b so that a resistance value corresponding to a reservoir size expected to be used in advance can be reproduced.

Thereby, the memory system MSc according to the fourth embodiment can adjust a substantive weight variation of the reservoir layer RL without executing writing and erasing with respect to each memory cell MCX of the reservoir layer RL. Therefore, the memory system MSc according to the fourth embodiment can more greatly reduce the time required to prepare for the learning processing than the third embodiment.

In the output unit OPc of the fourth embodiment, the number of pairs of a memory cell MCX and a switch SW coupled in parallel between the nodes N1 and N2 may be three or more. The resistance value (the number of times set pulses are applied after erasing) of each memory cell MCX may be uniform or different for each corresponding switch SW. The control device 208 may control an on/off of each of three or more switches SW according to the reservoir layer setting RLS.

[5] Others

Each of the embodiments described above can be modified in various manners. For example, the structure of the memory cell array 201 may be stacked. The input layer IL and the reservoir layer RL may be provided in the memory cell array 201 in the same layer, or in the memory cell arrays 201 in different layers. As the memory cell MC used in the memory cell array 201 and the memory cell MCo used in the determination circuit 214, resistance changing elements in the same scheme may be used or those in different schemes may be used. As the memory cell MC used in the memory cell array 201, an FTJ element may be used, or other resistance changing elements may be used. As the memory cell MCo, it is preferable that an FTJ element be used since a variation in resistance value is small. The resistance changing elements in the same scheme are used for the memory cell MC used in the memory cell array 201 and the memory cell MCo used in the determination circuit 214 so that manufacturing costs of the memory system MS can be reduced.

In the above embodiments, a case has been exemplified in which data related to a learning operation is exchanged between the memory controller 10 and the memory device 20, but the configuration is not limited thereto. The memory controller 10 may transmit data associated with machine learning such as supervised data and an instruction to execute machine learning to the memory device 20, and the memory device 20 may complete a learning operation without using the memory controller 10. That is, the memory device 20 may execute a series of processes related to the learning operation described in the above embodiments.

In the above embodiments, a case has been exemplified in which information on a weight variation of the reservoir layer RL is obtained from the setting information 110, but the configuration is not limited thereto. The memory device 20 may determine adjustment values for the weight variation based on formulae (1) to (3).

In each embodiment, the flowcharts used to explain operations are merely examples. In each operation, the order of processes may be interchanged to the extent possible, other processes may be added, or some processes may be omitted as long as the same result can be obtained. For example, the processes of S32 and S33 shown in FIG. 21 may be interchanged. In place of the CPU 103, a general-purpose processor such as a micro processing unit (MPU) or a graphical processing unit (GPU) may be used. Each of the processes described in connection with each embodiment may be implemented by dedicated hardware. Each operation described in connection with each embodiment may be a combination of a process executed by software and a process executed by hardware, or may be only one of the processes.

In this specification, the "word line WL" and "bit line BL" may be referred to as a "lateral interconnect" and a "vertical interconnect", respectively. Each of the word line WL and the bit line EL may be simply referred to as an "interconnect". The term "couple" means that elements are electrically coupled, and another element may be interposed between two coupled nodes. The "one end of the memory cell MC" corresponds to, for example, the upper electrode (conductive layer 30) of the memory cell MC. The "other end of the memory cell MC" corresponds to, for example, the lower electrode (conductive layer 31) of the memory cell MC. The application of a voltage to each interconnect may be described as being performed mainly by the control circuit 208 that manages the control of the memory device 20.

While certain embodiments of the present invention have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a plurality of first interconnects;
   a plurality of second interconnects each intersecting the first interconnects;
   a plurality of first memory cells respectively provided at intersections between the first interconnects and the second interconnects, each of the first memory cells being coupled between one of the first interconnects and one of the second interconnects;
   a plurality of third interconnects each intersecting the second interconnects, the third interconnects being respectively coupled to the second interconnects via a delay circuit;
   a plurality of second memory cells respectively provided at intersections between the third interconnects and the second interconnects, each of the second memory cells being coupled between one of the third interconnects and one of the second interconnects;
   a plurality of fourth interconnects respectively coupled to the second interconnects;
   a plurality of fifth interconnects each intersecting the fourth interconnects;
   a plurality of third memory cells respectively provided at intersections between the fourth interconnects and the fifth interconnects, each of the third memory cells being coupled between one of the fourth interconnects and one of the fifth interconnects; and
   a control circuit configured to execute machine learning, wherein
   each of the first memory cells, the second memory cells, and the third memory cells includes a resistance changing element, and
   in the machine learning, the control circuit is configured to:
     execute a write operation using a common write voltage to each of the second memory cells; and
     after the write operation, input input data to each of the first interconnects, and change a resistance value of at least one third memory cell of the third memory cells based on the input data and a signal output from each of the fifth interconnects based on the input data.

2. The semiconductor device of claim 1, wherein
   in the write operation, the control circuit is configured to determine a number of pulses of the write voltage to be applied to the second memory cells according to a number of the second interconnects or the third interconnects that are allocated.

3. The semiconductor device of claim 1, wherein
in the write operation, the control circuit is configured to determine an application time of the write voltage to the second memory cells according to a number of the second interconnects or the third interconnects that are allocated.

4. The semiconductor device of claim 1, wherein
the control circuit is configured to change a number of the second interconnects according to a type of the input data.

5. The semiconductor device of claim 1, wherein
the control circuit is configured not to change a resistance value of each of the first memory cells and the second memory cells after the write operation in the machine learning.

6. The semiconductor device of claim 1, wherein
the first memory cells are used for an input layer of reservoir computing,
the second memory cells are used for a reservoir layer of the reservoir computing, and
the third memory cells are used for an output layer of the reservoir computing.

7. The semiconductor device of claim 1, wherein
the resist changing element included in each of the first memory cancer cells, the second memory cells, and the third memory cells includes a ferroelectric film.

8. The semiconductor device of claim 7, wherein
each of the first memory cells, the second memory cells, and the third memory cells contains an oxide of at least one element of a group consisting of titanium (Ti), tungsten (W), tantalum (Ta), hafnium (Hf), aluminum (Al), and zinc (Zn).

9. A semiconductor device comprising:
a plurality of first interconnects;
a plurality of second interconnects each intersecting the first interconnects;
a plurality of first memory cells respectively provided at intersections between the first interconnects and the second interconnects, each of the first memory cells being coupled between one of the first interconnects and one of the second interconnects;
an output circuit including a plurality of output units, the output units including input nodes respectively coupled to the second interconnects;
a plurality of third interconnects each intersecting the second interconnects, the third interconnects being respectively coupled to output nodes of the output units via a delay circuit;
a plurality of second memory cells respectively provided at intersections between the third interconnects and the second interconnects, each of the second memory cells being coupled between one of the third interconnects and one of the second interconnects;
a plurality of fourth interconnects respectively coupled to the output nodes of the output units;
a plurality of fifth interconnects each intersecting the fourth interconnects;
a plurality of third memory cells respectively provided at intersections between the fourth interconnects and the fifth interconnects, each of the third memory cells being coupled between one of the fourth interconnects and one of the fifth interconnects; and
a control circuit configured to execute machine learning, wherein
each of the first memory cells, the second memory cells, and the third memory cells includes a resistance changing element, and
in the machine learning, the control circuit is configured to:
adjust a variation in output of the output units according to a number of the second interconnects; and
after adjusting the variation in output of the output units, input input data to each of the first interconnects, and change a resistance value of at least one third memory cell of the third memory cells based on the input data and a signal output from each of the fifth interconnects based on the input data.

10. The semiconductor device of claim 9, wherein
each of the output units includes a current-voltage conversion circuit and a differential amplifier circuit, and
the control circuit is configured to adjust the variation in output of the output units by adjusting a variable resistor included in the current-voltage conversion circuit and a reference voltage input to the differential amplifier circuit.

11. The semiconductor device of claim 10, wherein
the current-voltage conversion circuit includes a first operational amplifier and the variable resistor,
the differential amplifier circuit includes a second operational amplifier, a first resistor, a second resistor, a third resistor, and a fourth resistor, wherein a resistance value of the third resistor corresponds to a resistance value of the first resistor, and a resistance value of the fourth resistor corresponds to a resistance value of the second resistor,
an inverting input of the first operational amplifier is coupled to a corresponding one of the second interconnects, the variable resistor is coupled between an output of the first operational amplifier and the inverting input of the first operational amplifier, the first resistor is coupled between the output of the first operational amplifier and an inverting input of the second operational amplifier, the second resistor is coupled between the inverting input of the second operational amplifier and an output of the second operational amplifier, one end of the third resistor is coupled to a non-inverting input of the second operational amplifier, and one end of the fourth resistor is coupled between the non-inverting input of the second operational amplifier and a ground node,
the output of the second operational amplifier corresponds to one of the output nodes of the output units, and
the control circuit is configured to apply the reference voltage to another end of the third resistor.

12. The semiconductor device of claim 9, wherein
each of the output units includes a current-voltage conversion circuit that uses a fourth memory cell coupled to a corresponding second interconnect of the second interconnects, and a differential amplifier circuit, and
the control circuit is configured to adjust a variation in output of the output units by adjusting a reference voltage input to the differential amplifier circuit.

13. The semiconductor device of claim 12, wherein
the current-voltage conversion circuit includes a first operational amplifier,
the differential amplifier circuit includes a second operational amplifier, a first resistor, a second resistor, a third resistor, and a fourth resistor, wherein a resistance value of the third resistor corresponds to a resistance value of the first resistor, and a resistance value of the fourth resistor corresponds to a resistance value of the second resistor, an inverting input of the first operational amplifier is coupled to the corresponding second interconnect, the fourth memory cell is coupled between an output of the first operational amplifier and the inverting input of the first operational amplifier, the first resistor is coupled between the output of the first operational amplifier and an inverting input of the second operational amplifier, the second resistor is coupled between the inverting input of the second operational amplifier and an output of the second operational amplifier, one end of the third resistor is coupled to a non-inverting input of the second operational amplifier, and one end of the fourth resistor is coupled between the non-inverting input of the second operational amplifier and a ground node, the output of the second operational amplifier corresponds to one of the output nodes of the output units, and the control circuit is configured to apply the reference voltage to another end of the third resistor.

14. The semiconductor device of claim 9, wherein each of the output units includes a current-voltage conversion circuit that uses a plurality of fourth memory cells coupled to a corresponding second interconnect of the second interconnects, and a differential amplifier circuit, the fourth memory cells and the output circuit are coupled respectively via a plurality of switches, and the control circuit is configured to adjust a variation in output of the output units by adjusting an on/off of the switches and a reference voltage input to the differential amplifier circuit.

15. The semiconductor device of claim 14, wherein the current-voltage conversion circuit includes a first operational amplifier, the differential amplifier circuit includes a second operational amplifier, a first resistor, a second resistor, a third resistor, and a fourth resistor, wherein a resistance value of the third resistor corresponds to a resistance value of the first resistor, and a resistance value of the fourth resistor corresponds to a resistance value of the second resistor, an inverting input of the first operational amplifier is coupled to the corresponding second interconnect, the fourth memory cells are coupled between an output of the first operational amplifier and the inverting input of the first operational amplifier respectively via the switches, the first resistor is coupled between the output of the first operational amplifier and an inverting input of the second operational amplifier, the second resistor is coupled between the inverting input of the second operational amplifier and an output of the second operational amplifier, one end of the third resistor is coupled to a non-inverting input of the second operational amplifier, and one end of the fourth resistor is coupled between the non-inverting input of the second operational amplifier and a ground node, the output of the second operational amplifier corresponds to one of the output nodes of the output units, and the control circuit is configured to apply the reference voltage to another end of the third resistor.

16. The semiconductor device of claim 9, wherein the control circuit is configured to change a number of the second interconnects according to a type of the input data.

17. The semiconductor device of claim 9, wherein the control circuit is configured not to change a resistance value of each of the first memory cells and the second memory cells after adjusting the variation in the machine learning.

18. The semiconductor device of claim 9, wherein the first memory cells are used for an input layer of reservoir computing, the second memory cells are used for a reservoir layer of the reservoir computing, and the third memory cells are used for an output layer of the reservoir computing.

19. The semiconductor device of claim 9, wherein the resistance changing element included in each of the first memory cells, the second memory cells, and the third memory cells includes a ferroelectric film.

20. The semiconductor device of claim 19, wherein each of the first memory cells, the second memory cells, and the third memory cells contains an oxide of at least one of a group consisting of titanium (Ti), tungsten (W), tantalum (Ta), hafnium (Hf), aluminum (Al), and zinc (Zn).

* * * * *